United States Patent
Yuan et al.

(10) Patent No.: US 10,371,325 B1
(45) Date of Patent: Aug. 6, 2019

(54) FULL SPECTRUM WHITE LIGHT EMITTING DEVICES

(71) Applicant: Intematix Corporation, Fremont, CA (US)

(72) Inventors: Xianglong Yuan, Manteca, CA (US); Yi-Qun Li, Danville, CA (US)

(73) Assignee: Intematix Corporation, Fremont, CA (US)

(*) Notice: Subject to any disclaimer, the term of this patent is extended or adjusted under 35 U.S.C. 154(b) by 0 days.

(21) Appl. No.: 16/212,687

(22) Filed: Dec. 7, 2018

Related U.S. Application Data

(63) Continuation-in-part of application No. 16/207,039, filed on Nov. 30, 2018.

(60) Provisional application No. 62/689,538, filed on Jun. 25, 2018.

(51) Int. Cl.

| | |
|---|---|
| *F21K 9/64* | (2016.01) |
| *H01L 25/075* | (2006.01) |
| *H01L 33/50* | (2010.01) |
| *H01L 33/06* | (2010.01) |
| *F21V 15/01* | (2006.01) |
| *H01L 33/62* | (2010.01) |
| *H01L 33/54* | (2010.01) |
| *F21Y 115/10* | (2016.01) |
| *F21Y 105/10* | (2016.01) |
| *F21Y 113/13* | (2016.01) |

(52) U.S. Cl.
CPC ............ *F21K 9/64* (2016.08); *F21V 15/01* (2013.01); *H01L 25/0753* (2013.01); *H01L 33/06* (2013.01); *H01L 33/507* (2013.01); *H01L 33/54* (2013.01); *H01L 33/62* (2013.01); *F21Y 2105/10* (2016.08); *F21Y 2113/13* (2016.08); *F21Y 2115/10* (2016.08); *H01L 33/502* (2013.01)

(58) Field of Classification Search
CPC ..... F21K 9/64; H01L 25/0753; H01L 33/507; H01L 33/54; H01L 33/62; H01L 33/06; F21V 15/01
See application file for complete search history.

(56) References Cited

U.S. PATENT DOCUMENTS

| | | | |
|---|---|---|---|
| 8,188,492 | B2 | 5/2012 | Lee et al. |
| 9,004,705 | B2 | 4/2015 | Li et al. |
| 9,590,149 | B2 | 3/2017 | Lim et al. |
| 9,698,317 | B2 | 7/2017 | Park et al. |
| 9,997,669 | B2 | 6/2018 | Im et al. |
| 2012/0138874 | A1 | 6/2012 | Yuan et al. |
| 2013/0235554 | A1 | 9/2013 | McDavitt |
| 2014/0158982 | A1 | 6/2014 | Park et al. |
| 2015/0340573 | A1 | 11/2015 | Yuan et al. |

FOREIGN PATENT DOCUMENTS

| | | |
|---|---|---|
| KR | 1020150092800 | 8/2015 |

Primary Examiner — Joseph L Williams

(57) ABSTRACT

A full spectrum light emitting device includes photoluminescence materials which generate light with a peak emission wavelength in a range 490 nm to 680 nm (green to red) and a broadband solid-state excitation source operable to generate broadband blue excitation light with a dominant wavelength in a range from 420 nm to 470 nm, where the broadband blue excitation light includes at least two different blue light emissions in a wavelength range 420 nm to 480 nm.

28 Claims, 17 Drawing Sheets

SECTION A-A

SECTION A-A

SECTION B-B

FULL SPECTRUM WHITE LIGHT EMITTING DEVICES

FIELD OF THE INVENTION

Embodiments of the present invention are directed to full spectrum white light emitting devices comprising photoluminescence wavelength conversion materials. More particularly, although not exclusively, embodiments concern full spectrum white light emitting devices for generating full spectrum white light having a spectrum from blue light to red light that closely resembles natural sunlight. Embodiments of the invention further concern full spectrum white light emitting devices that generate full spectrum white light having a high Color Rendering Index (CRI) and/or Fidelity index.

BACKGROUND OF THE INVENTION

White light emitting LEDs ("white LEDs") include one or more photoluminescence materials (typically inorganic phosphor materials), which absorb a portion of the blue light emitted by the LED and re-emit visible light of a different color (wavelength). The portion of the blue light generated by the LED that is not absorbed by the phosphor material combined with the light emitted by the phosphor provides light which appears to the eye as being white in color. Due to their long operating life expectancy (>50,000 hours) and high luminous efficacy (100 lumens per watt and higher), white LEDs are rapidly replacing conventional fluorescent, compact fluorescent and incandescent lamps.

Various metrics exist for quantifying the characteristics and quality of light generated by white lighting sources. The two most commonly used metrics within the solid-state lighting industry are, Correlated Color Temperature (CCT) and International Commission on Illumination (CIE) General Color Rendering Index (CRI) Ra.

The CCT of a lighting source is measured in kelvin (K) and is the color temperature of a Planckian (black-body) radiator that radiates light of a color that corresponds to the color of the light generated by the lighting source.

The General CRI Ra characterizes how faithfully a lighting source renders the true colors of an object and is based on a measure of how well a lighting source's illumination of eight color test samples (R1 to R8) compares with the illumination provided by a reference source. In general, the higher the value indicates its closeness to a black radiator and natural sunlight. General CRI Ra can take negative values and has a maximum value of 100. Since the color samples R1 to R8 are all pastel colors (low saturation colors "Light Grayish Red" to "Reddish Purple") the General CRI Ra gives a useful measure of subtle differences in light output of incandescent sources which generate a full spectrum that closely resembles sunlight. However, for white LEDs whose spectrum is composed of peaks, the General CRI Ra is proving to be inadequate as it is an average measure of color rendition over a limited range of colors and gives no information of the lighting source's performance for particular colors or highly saturated colors. Thus, when characterizing full spectrum solid-state white light emitting devices the CRI color samples R9 to R12 (saturated colors "Saturated Red", "Saturated Yellow", "Saturated Green", "Saturated Blue") and R13 to R15 ("Light Skin Tone", "Leaf Green", "Medium Skin Tone") should be taken into account to give a meaningful characterization of full spectrum light.

To address the limitations of General CRI Ra, the Illuminating Engineering Society (IES) recently published the TM-30 standard for measuring and characterizing the color performance of lighting sources (Illuminating Engineering Society (2015) "Method for Evaluating Light Source Color Rendition" TM-30-15). Under the TM-30-15 standard, two metrics are used to characterize the color rendering characteristics of a lighting source, Fidelity Index ($R_f$) and Gamut Index ($R_g$). It is believed that IES TM-30-15 method has better correlation with people's color perception and, therefore, gives a more accurate characterization of a lighting source's light characteristics. The Fidelity Index $R_f$ is similar to General CRI Ra and characterizes how faithfully a lighting source renders the true colors of an object and is based on a measure of how well a lighting source's illumination of 99 color samples compares with the illumination provided by a reference source. The Fidelity Index $R_f$ value ranges from 0 to 100. The new color samples have been selected to be more representative of objects that are likely to be encountered in real-life applications and, as a result, the Fidelity Index $R_f$ is believed to be a more accurate measure of color rendering than the General CRI Ra. Since $R_f$ is measured over a greater number of color samples, it will be more difficult to achieve high scores compared with the General CRI Ra. Moreover, due to the different testing procedures, General CRI Ra and Fidelity Index $R_f$ values are not comparable against each other.

The Gamut Index $R_g$ focuses on color saturation and is an average level of saturation compared with a reference source. The Gamut Index correlates to the vividness of the appearance of colored objects. The Gamut Index $R_g$ value ranges from 60 to 140 where values below 100 indicate decreased saturation and values above 100 indicate increased saturation compared with the reference source.

A further problem with known white LEDs, that are commonly used in display backlights of cell phones, is the damage they potentially cause to the human eye and particularly in view of ever-increasing screen-time usage. The American Macular Degeneration Foundation (AMDF) have reported that the blue rays of the spectrum appear to accelerate age-related macular degeneration (AMD) more than any other rays in the spectrum. High Energy Visible (HEV) blue light in the region of 400 nm-500 nm has been identified for years as the most dangerous light for the retina. Almost all visible blue light passes through the cornea and lens and reaches the retina. This light can affect vision and can prematurely age the eyes. Early research shows that too much exposure to blue light (HEV) can lead to digital eyestrain and retinal damage. This can cause vision problems such as age-related macular degeneration. This damage occurs when blue light (HEV) penetrates the macular pigment of the eye and causes a breakdown of the retina, leaving the eye more vulnerable to blue light exposure and cell degeneration.

The present invention arose in an endeavor to improve the color rendition of full spectrum light emitting devices comprising photoluminescence conversion materials that generate white light having high color rendering characteristics such as a high CRI Ra and/or high Fidelity index $R_f$. The present invention also ameliorates problems associated with White LEDs causing damage to the human eye by exposure to HEV as discussed above.

SUMMARY OF THE INVENTION

The invention concerns full spectrum white light emitting devices for generating full spectrum white light having a spectral content from blue light to red light that resembles natural sunlight as closely as possible. Full spectrum white light emitting devices in accordance with the invention utilize broadband blue solid-state excitation sources, for example blue LEDs, which generate broadband blue excitation light with a dominant wavelength in a range from 420 nm to 480 nm. In this patent specification "broadband" blue light is used to denote blue light that is composed of a combination of at least two different wavelength blue light emissions in a wavelength range 420 nm to 480 nm.

Broadband blue excitation light can be generated using a combination of blue light emissions of two or more different wavelengths; for example, a combination of shorter wavelength blue light in a wavelength range 420 nm to 450 nm and longer wavelength blue light in a wavelength range 450 nm to 480 nm. The different wavelength blue light emissions can be generated in two ways: (i) using multiple individual blue LEDs (narrowband LEDs) of different dominant wavelengths or (ii) individual LEDs (broadband LEDs) that generate multiple blue wavelength emissions using, for example, specially designed multiple different quantum wells in the active region. Thus, a broadband blue solid-state excitation source can be constituted by one or more narrowband solid-state light sources; such as for example, LEDs or laser diodes, each of which "directly" generates narrowband blue light of different dominant wavelengths in a range from 420 nm to 480 nm. Alternatively, a broadband blue solid-state excitation source also encompasses a broadband blue solid-state light source; for example, a broadband blue LED such as an InGaN/GaN blue LED having an active region that directly generates blue light emissions of multiple different wavelengths using different quantum wells in a multiple-quantum-well (MQW) structure. Broadband blue solid-state excitation sources of the invention are to be contrasted with known white LEDs that utilize narrowband blue LEDs and generate blue light of a single narrowband wavelength having a FWHM (Full Width Half Maximum) in a range 15 nm to 20 nm. Typically, the FWHM of broadband blue excitation light of the present invention is in a wavelength range 25 nm to 50 nm, though it can be in ranges 30 nm to 50 nm, 35 nm to 50 nm, 40 nm to 50 nm or 45 nm to 50 nm. Broadband blue solid-state excitation sources of the invention are to be further contrasted with known white LEDs that utilize UV solid-state light sources (UV LEDs) in which the blue excitation light is generated indirectly through a process of photoluminescence conversion of UV light using a blue light emitting (420 nm-480 nm) photoluminescence material (phosphor). In other words, broadband blue solid-state excitation sources/white light emitting devices in accordance with the invention do not utilize/include a photoluminescence material to generate excitation light in a range 420 nm-480 nm.

According to an embodiment of the invention, a full spectrum light emitting device may comprise: photoluminescence materials which generates light with a peak emission wavelength in a range 490 nm to 680 nm (green to red region of the visible spectrum) and a broadband blue solid-state excitation source operable to generate broadband blue excitation light with a dominant wavelength in a range from 420 nm to 480 nm, wherein the broadband blue excitation light comprises at least two different wavelength blue light emissions in a wavelength range 420 nm to 480 nm. Full spectrum light emitting devices formed in accordance with the invention and comprising a broadband blue solid-state excitation source which generates broadband blue excitation light (i.e. composed of multiple wavelength blue light emissions) are found to increase the color rendering of white light generated by the device in particular CRI R11 (saturated green) and CRI R12 (saturated blue). Known white LEDs that utilize narrowband (FWHM 15 nm-20 nm) blue excitation sources and phosphor conversion in the green, yellow and red regions of the visible spectrum exhibit a strong narrow blue peak emission that exceeds that of sunlight and broadband phosphor emissions covering green, yellow and red spectrum for color temperature ranging from 3000K to 6500K. Moreover, there is a pronounced trough (valley) in the cyan region of the spectrum (490 nm to 520 nm) between the blue LED emission and phosphor emission resulting in low values for CRI R11 and CRI R12, particularly for CCT in a range 4000K to 6500K. In contrast, in full spectrum light emitting devices in accordance with the invention that utilize broadband blue solid-state excitation sources, the broadband blue excitation light partially fills the cyan spectrum trough thereby significantly improving CRI R11 and CRI R12.

Light emitting devices in accordance with the invention can generate white light that more closely resembles natural sunlight than the known white LEDs. In some embodiments, light emitting devices may be characterized by generating white light with a CRI R1 to CRI R15 (full color spectrum) of greater than or equal to 90 and/or a general CRI Ra of greater than or equal to 95. In some embodiments, the light emitting device may be characterized by generating white light with a CRI R1 to CRI R15 of greater than or equal to 95 and/or a general CRI Ra of greater than or equal to 99. In embodiments, the light emitting device may be characterized by generating white light with a CRI R12 ("Saturated Blue") of greater than or equal to 90. In embodiments, the light emitting device may be characterized by generating white light with a IEC TM-30 fidelity index $R_f$ of greater than or equal to 96.

In embodiments, the light emitting device may be operable to generate white light with a color temperature in a range from about 2500 K to about 6500K, a color temperature in a range from about 2500 K to about 3000K, a color temperature in a range from about 4000 K to about 5000K, or a color temperature in a range from about 5000 K to about 6500K.

In some embodiments, there is a difference in wavelength between the at least two blue light emissions of at least 5 nm or at least 10 nm. The broadband blue solid-state excitation source can generate broadband blue excitation light with a FWHM in a range 25 nm to 50 nm.

The broadband blue solid-state excitation source may comprise two or more solid-state light sources which generate narrowband blue light emissions with a different respective dominant wavelength and the excitation light may comprise the combined light generated by the solid-state light sources. In one such embodiment, a solid-state excitation source comprises a first solid-state light source operable to generate a blue light emission with a first dominant wavelength in a range 420 nm to 450 nm and a second solid-state light source operable to generate blue light emission with a second dominant wavelength in a range from 450 nm to 480 nm. In such an arrangement, the broadband blue excitation light comprises combined light generated by the first and second solid-state light sources. In some embodiments, the first dominant wavelength is in a range from 420 nm to 450 nm; and the second dominant wavelength is in a range from 450 nm to 480 nm.

In other embodiments, the broadband blue solid-state excitation source may comprise an LED having an active region with at least two different quantum wells that each generate a respective one of the at least two different blue light emissions.

In embodiments, the photoluminescence materials can comprise a green to yellow photoluminescence material which generates light with a peak emission wavelength in a range 490 nm to 550 nm and a red photoluminescence material which generates light with a peak emission wavelength in a range 600 nm to 680 nm. Embodiments of the invention can further comprise an orange to red photoluminescence material which generates light with a peak emission wavelength in a range 600 nm to 650 nm.

In embodiments, the light emitting device is characterized by a luminous efficacy (LE) of greater than or equal to 220 lm/$W_{opt}$ or by a luminous efficacy (LE) of greater than or equal to 260 lm/$W_{opt}$.

Embodiments of the invention find utility in a packaged device where the green to yellow photoluminescence material, red photoluminescence material and optional orange to red photoluminescence material are packaged with the broadband blue solid-state excitation source. In other embodiments, the photoluminescence material can be located remote to the broadband blue solid-state excitation source.

While the invention arose in relation to white light emitting devices for generating full spectrum white light having high color rendering qualities, that is a general CRI Ra of greater than or equal to 95, the invention also finds utility for light emitting devices that generate light with lower CRI Ra, greater than or equal to 80. In such applications, the use of a broadband blue solid-state excitation source can reduce damage to the human retina and/or reduce degeneration of the human macular compared with the known white LEDs that utilize narrow band blue excitation sources. This is because the same blue photon energy is distributed over a greater wavelength range thereby reducing the intensity of the blue peak.

In embodiments, there is envisaged a light emitting device as described herein for use in reducing damage to the human retina, or reducing degeneration of the human macula.

In embodiments, there is encompassed use of a light emitting device as described herein in reducing damage to the human retina, or reducing degeneration of the human macula.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE INVENTION

Figure 1A:
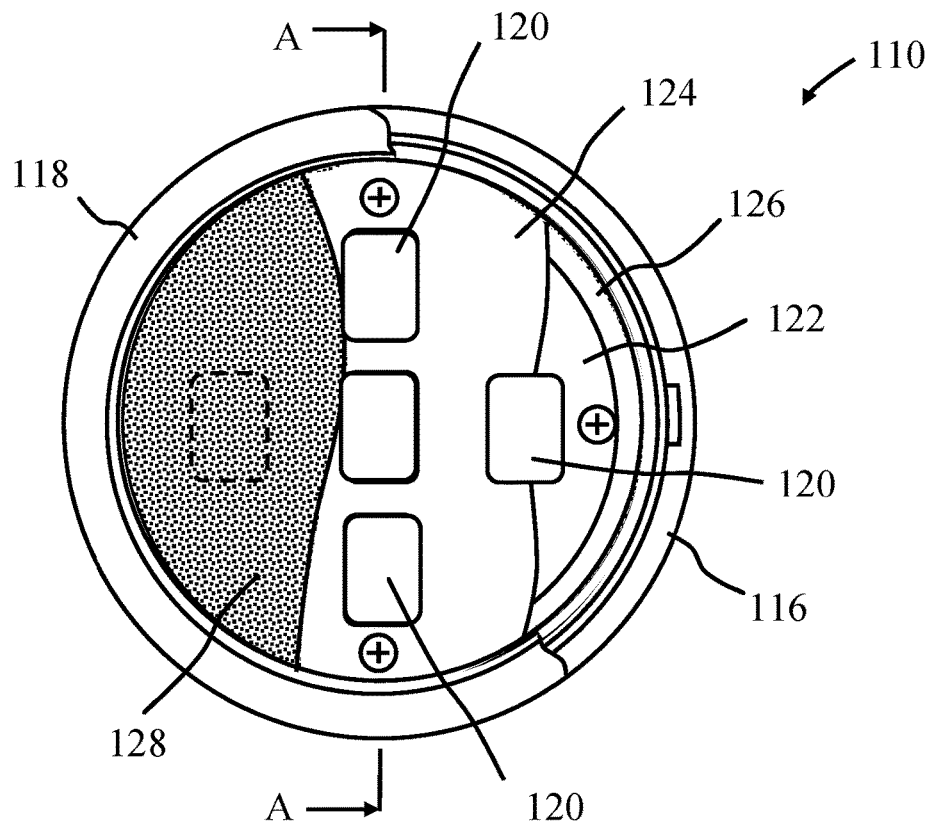
FIGS. 1a and 1b show a remote phosphor full spectrum white light emitting device, according to some embodiments.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Throughout this specification, like reference numerals preceded by the figure number are used to denote like features.

Embodiments of the invention concern white light emitting devices that comprise a broadband solid-state excitation source, for example one or more LEDs, that is operable to generate broadband blue excitation light with a dominant wavelength in a range from 420 nm to 480 nm. In this patent specification "broadband" blue light is used to denote blue light that is composed of a combination of at least two different wavelength blue light emissions in a wavelength range 420 nm to 480 nm. More particularly, although not exclusively, embodiments of the invention concern white light emitting devices for generating full spectrum white light that closely resembles sunlight and has high color rendering properties. Embodiments of the invention also concern solid-state white light emitting devices with a broadband blue spectral content that ameliorate problems associated with high intensity of narrow band blue causing damage to the human eye by exposure to blue light (HEV) in the region of 400-500 nm.

Remote Phosphor Full Spectrum White Light Emitting Devices

Figure 1B:
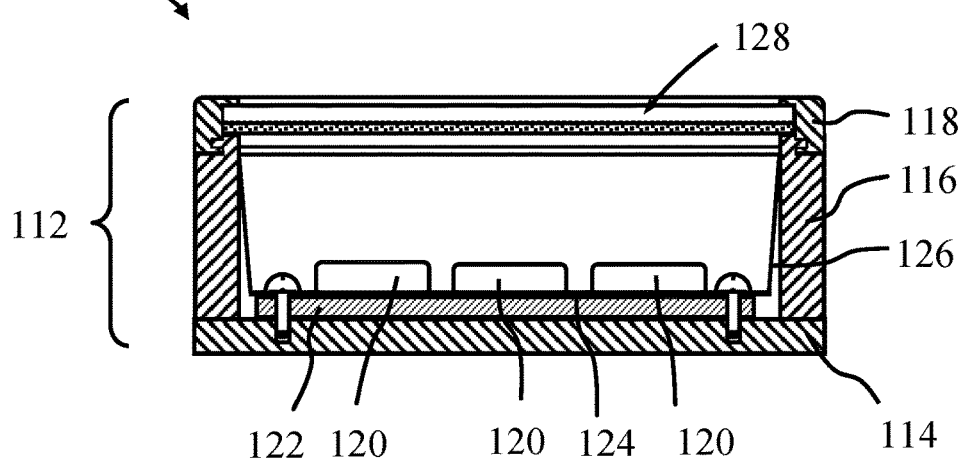

FIGS. 1a and 1b illustrate a remote phosphor solid-state full spectrum white light emitting device according to an embodiment of the invention in which FIG. 1a is a partial cross-sectional plan view and FIG. 1b is a sectional view through A-A. The device 110 is configured to generate warm white light with a CCT (Correlated Color Temperature) of between 2500K and 5000K and a CRI (Color Rendering Index) of greater than 95. The device can be used alone or comprise a part of a downlight or other lighting arrangement. The device 110 comprises a hollow cylindrical body 112 composed of a circular disc-shaped base 114, a hollow cylindrical wall portion 116 and a detachable annular top 118. To aid in the dissipation of heat, the base 114 is preferably fabricated from aluminum, an alloy of aluminum or any material with a high thermal conductivity. The base 114 can be attached to the wall portion 116 by screws or bolts or by other fasteners or by means of an adhesive.

The device 110 further comprises a plurality (five in the example of FIGS. 1a and 1b) of broadband blue solid-state excitation sources 120 that are mounted in thermal communication with a circular-shaped MCPCB (metal core printed circuit board) 122. Various embodiments of the broadband blue solid-state excitation sources 120 are illustrated in FIGS. 2a to 4b. To maximize the emission of light, the device 10 can further comprise light reflective surfaces 124 and 126 that respectively cover the face of the MCPCB 122 and the inner curved surface of the cylindrical wall 116.

The device 110 further comprises a photoluminescence wavelength conversion component 128 that is located remotely to the excitation sources 120 and operable to absorb a portion of the excitation light generated by the excitation sources 120 and convert it to light of a different wavelength by a process of photoluminescence. The emission product of the device 110 comprises the combined light generated by the broadband blue excitation sources 120 and photoluminescence light generated by the photoluminescence wavelength conversion component 128. The photoluminescence wavelength conversion component may be formed of a light transmissive material (for example, polycarbonate, acrylic material, silicone material, etc.) that incorporates a mixture of a yellow, red and/or green phosphor. Furthermore, in embodiments, the photoluminescence wavelength conversion component may be formed of a light transmissive substrate that is coated with phosphor material(s). The wavelength conversion component 128 is positioned remotely to the excitation sources 120 and is spatially separated from the excitation sources. In this patent specification, "remotely" and "remote" means in a spaced or separated relationship. Typically, wavelength conversion component and excitation sources are separated by an air, while in other embodiments they can be separated by a suitable light transmissive medium, such as for example a light transmissive silicone or epoxy material. The wavelength conversion component 128 is configured to completely cover the housing opening such that all light emitted by the lamp passes through the wavelength component 128. As shown, the wavelength conversion component 128 can be detachably mounted to the top of the wall portion 116 using the top 118 enabling the component and emission color of the lamp to be readily changed.

Figure 2A:
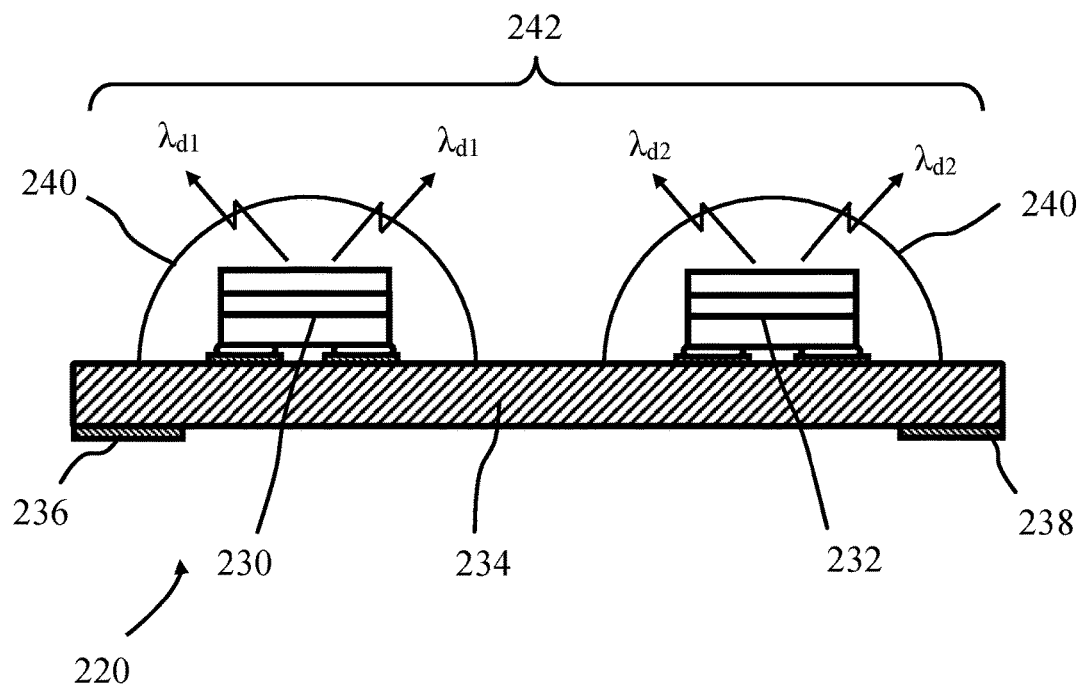
FIG. 2a is a schematic of a broadband blue solid-state excitation source in accordance with an embodiment of the invention for use in the full spectrum white light emitting device of FIGS. 1a and 1b.

FIG. 2a is a schematic representation of a broadband blue solid-state excitation source 220, according to an embodiment of the invention. The broadband blue solid-state excitation source 220 is configured to generate broadband blue excitation light with a dominant wavelength in a range 420 nm to 470 nm, that is, in the blue region of the visible spectrum. In this embodiment, it also has a FWHM in a range 25 nm to 50 nm. In accordance with an embodiment of the invention, the broadband blue solid-state excitation source 220 comprises a first solid-state light source 230 and a second solid-state light source 232, which in this example are narrowband blue LED chips (e.g. blue-emitting GaN-based LED chips). The first solid-state light source 230 generates a blue light emission having a first dominant wavelength $\lambda_{d1}$ in a range from 420 nm to 470 nm and the second solid-state light source 232 generates a blue light emission having a second dominant wavelength $\lambda_{d2}$ in a range from 420 nm to 470 nm. The first and second solid-state light sources are selected such that the dominant wavelengths of light generated by the sources are different (i.e. $\lambda_{d1}$ is different to $\lambda_{d2}$). The combination of light from the first and second solid-state light sources 230/232 constitutes the broadband blue excitation light output 242 of the broadband blue solid-state excitation source 220 and has a dominant wavelength in a range 420 nm to 470 nm and has a FWHM in a range 25 nm to 50 nm. It will be understood that in other embodiments the solid-state excitation source may comprise a single solid-state light source. In this specification, a single solid-state light source is defined as one or more solid-state light sources each of which generates light with the same (i.e. single/solitary) dominant wavelength and with a FWHM of at least 25 nm.

As indicated in FIG. 2a, the broadband blue solid-state excitation source 220 can comprise a surface mountable device (SMD), such as for example an SMD 2835 LED package, in which the first and second solid-state light sources are flip-chip bonded on a top face of a substrate 234. Electrical contacts 236, 238 can be provided on the bottom face of the substrate 234 for operating the excitation source. The first and second solid-state light sources 230, 232 can be encapsulated with a light transmissive optical encapsulant 240, such as for example a silicone or epoxy material.

Figure 2B:
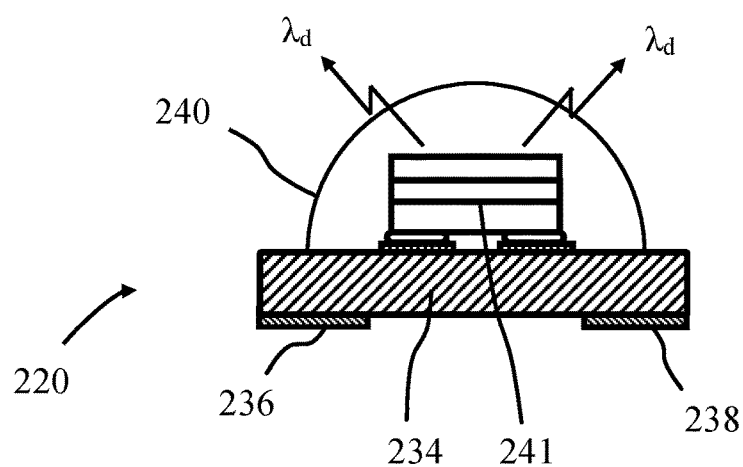
FIG. 2b is a schematic of a broadband blue solid-state excitation source in accordance with an another embodiment of the invention for use in the full spectrum white light emitting device of FIGS. 1a and 1b.

FIG. 2b is a schematic representation of a broadband blue solid-state excitation source 220, according to an embodiment of the invention. The solid-state excitation source 220 is configured to generate excitation light with a dominant wavelength in a range 420 nm to 470 nm, that is, in the blue region of the visible spectrum. In this embodiment, it also has a FWHM in a range 25 nm to 50 nm. In accordance with an embodiment of the invention, the solid-state excitation source 220 comprises a broadband solid-state light source 241, which in this example is a single broadband LED such as for example an InGaN/GaN blue LED having an active region with multiple-quantum-wells (MQWs), as disclosed in Appl. Phys. lett. 75, 1494 (1999) Tran C A et al. entitled "Growth of InGaN multiple-quantum-well blue light-emitting diodes on silicone by metal organic vapor phase epitaxy". The broadband solid-state light source 241 generates broadband blue light comprising multiple overlapping blue light emissions of peak wavelengths in a range from 420 nm to 470 nm. Thus, the single solid-state light source 241 generates light with a single/solitary dominant wavelength and with a FWHM of at least 25 nm.

As indicated in FIG. 2b, the solid-state excitation source 220 can comprise a surface mountable device (SMD), such as for example an SMD 2835 LED package, in which the solid-state light source is flip-chip bonded on a top face of a substrate 234. Electrical contacts 236, 238 can be provided on the bottom face of the substrate 234 for operating the excitation source. The solid-state light source 241 can be encapsulated with a light transmissive optical encapsulant 240, such as for example a silicone or epoxy material.

Packaged Full Spectrum White Light Emitting Devices

Figure 3A:
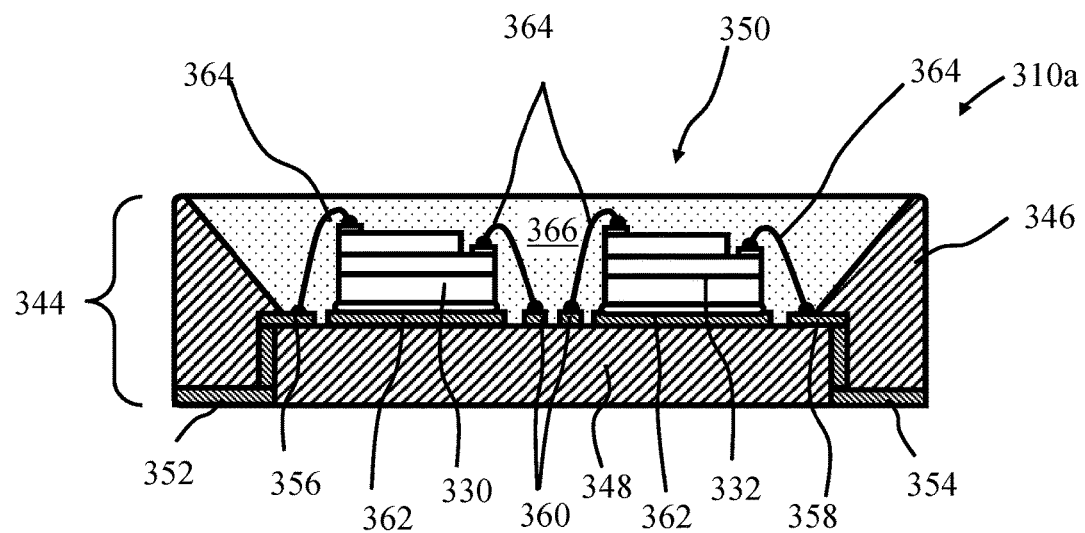
FIG. 3a is a schematic cross-sectional view of a full spectrum white light emitting device, according to some embodiments.

FIG. 3a is a schematic cross-sectional representation of a packaged full spectrum white light emitting device 310a, according to an embodiment of the invention. The device 310a is configured to generate warm white light with a CCT (Correlated Color Temperature) of in a range 2700 K to 5000K and a General CRI (Color Rendering Index) CRI (Ra) of 95 and higher.

In accordance with embodiments of the invention, the device 310a comprises a broadband blue solid-state excitation source constituted by first and second solid-state light sources 330, 332, for example blue-emitting GaN (gallium nitride)-based LED chips, that are housed within a package 344. In a similar/same manner as described above, the first solid-state light source 330 can generate a blue light emission having a first dominant wavelength $\lambda_{d1}$ in a range from 420 nm to 470 nm and the second solid-state light source 332 can generate a blue light emission having a second dominant wavelength $\lambda_{d2}$ in a range from 420 nm to 470 nm. The dominant wavelength $\lambda_{d1}$ of the first solid-state light source is different from the dominant wavelength 2 of the second solid-state light source. The package, which can for example comprise Surface Mountable Device (SMD) such as an SMD 2835 LED package, comprising upper portion 346 and base portion 348. The upper body part 346 defines a recess 350 which is configured to receive the solid-state light sources 330, 332. The package 344 can further comprise electrical connectors 352 and 354 on an exterior face of the base of the package 344. The electrical connectors 352, 354 can be electrically connected to electrode contact pads 356, 358 and 360 on the floor of the recess 350. Using adhesive or solder, the solid-state light sources (LED chips) 330, 332 can be mounted to a thermally conductive pad 362 located on the floor of the recess 350. The LED chip's electrode pads can be electrically connected to corresponding electrode contact pads 356, 358 and 360 on the floor of the package 344 using bond wires 362. Alternatively, the LED chips can be flip-chip mounted in and electrically connected to the package. The recess 350 is filled with a light transmissive optical encapsulant 364, typically an optically clear silicone, which is loaded with a mixture of photoluminescence materials such that the exposed surfaces of the LED chips 330, 332 are covered by the photoluminescence/silicone material mixture. To enhance the emission brightness of the device the walls of the recess 350 can be inclined and have a light reflective surface. Of course, it will be understood that in other embodiments the one or more solid-state light sources (LED chips 330, 332) each generate light with the same (i.e. single/solitary) dominant wavelength and with a FWHM of at least 25 nm.

Figure 3B:
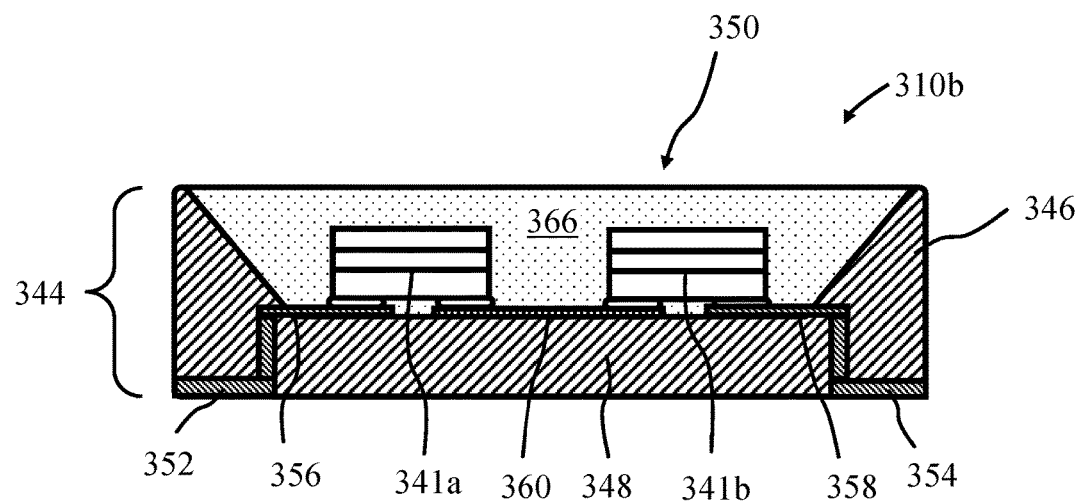
FIG. 3b is a schematic cross-sectional view of a full spectrum white light emitting device, according to some embodiments.

FIG. 3b is another embodiment of the present invention. It is similar to FIG. 3a except that the first and second narrowband solid-state light sources are replaced by two broadband blue LEDs 341a/341b having an active region with multiple-quantum-wells. Typically, the first and second broadband blue solid-state light sources 341a/341b each generate broadband blue excitation light having dominant wavelengths $\lambda_d$ which are the same.

Figure 4A:
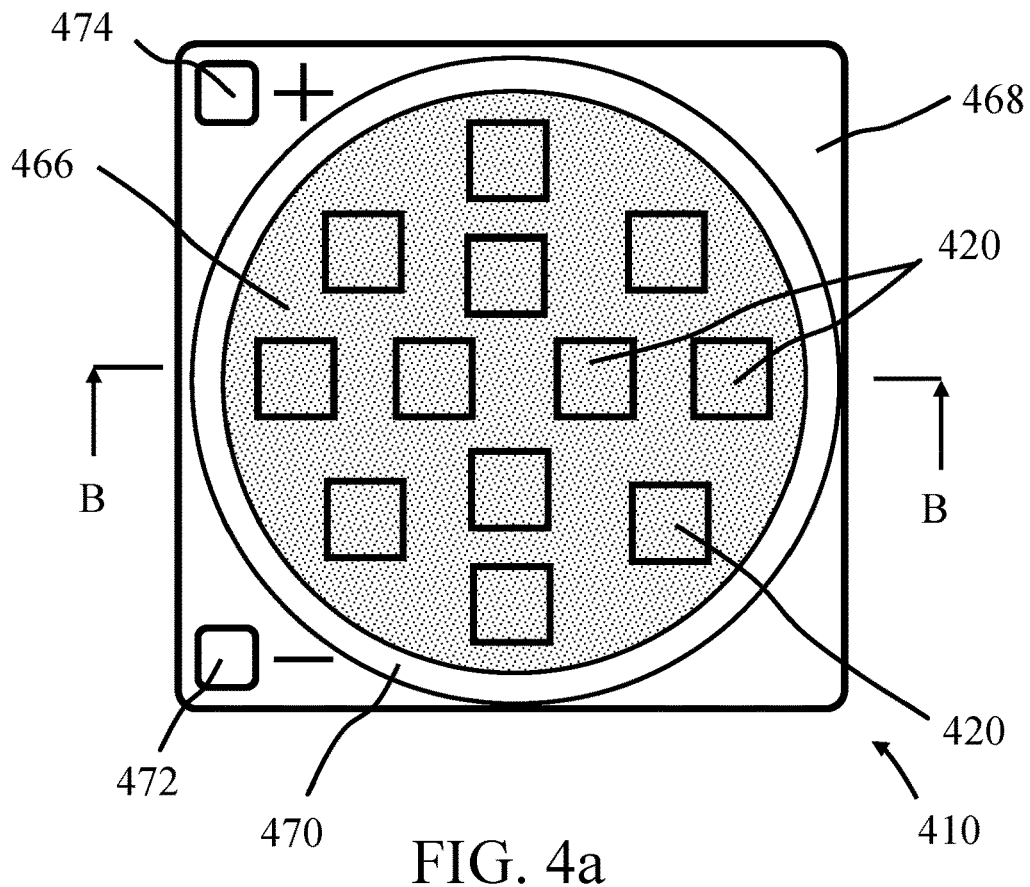
FIGS. 4a and 4b is a schematic of a full spectrum white light emitting device, according to some embodiments.
Figure 4B:
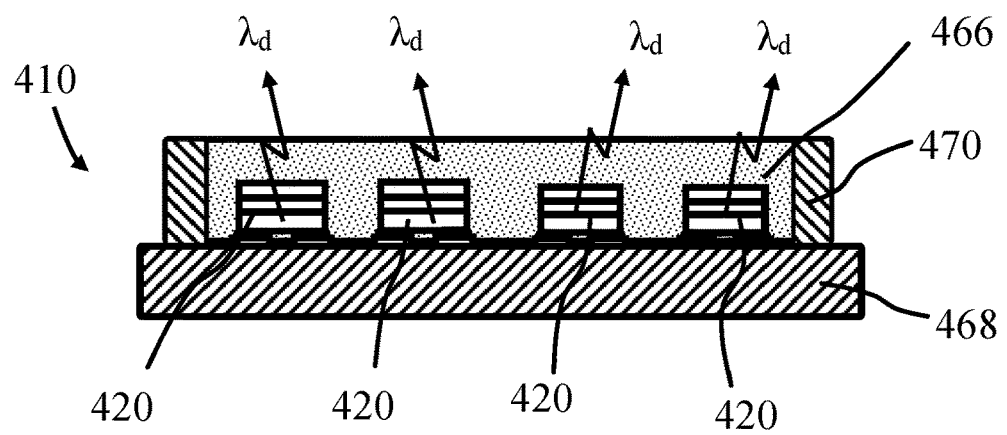

FIGS. 4a and 4b illustrate a Chip On Board (COB) packaged full spectrum white light emitting device 410 according to an embodiment of the invention in which FIG. 4a is a plan view and FIG. 4b is a sectional view through B-B. The device 410 is configured to generate warm white light with a CCT (Correlated Color Temperature) of between 2500K and 5000K and a CRI (Color Rendering Index) of greater than 95.

The device 410 comprises a plurality (twelve in the example of FIG. 4a) broadband blue solid-state excitation sources 420, for example broadband blue-emitting GaN (gallium nitride)-based LED flip-chip dies, mounted in thermal communication with a square-shaped MCPCB 468.

As indicated in FIG. 4a, the excitation sources 420 can be configured as a generally circular array. The solid-state excitation sources (broad-band LED dies) 420 can each generate excitation light having a dominant wavelength $\lambda_d$ in a range from 440 nm to 455 nm. In this embodiment, they have a FWHM (Full Width Half Maximum) in a range 25 nm to 50 nm. Electrical contacts 472, 474 can be provided on the top face of the MCPCB 468 for operating the white light emitting device 410. As shown, the broad-band LED flip-chip dies 420 are encapsulated with a light transmissive optical encapsulant 466, such as for example a silicone or epoxy material, which is loaded with a mixture of photoluminescence materials such that the exposed surfaces of the LED dies 420 are covered by the photoluminescence/silicone material mixture. As shown, the light transmissive encapsulant/photoluminescence material mixture 466 can be contained within an annular-shaped wall 470. Of course, it will be understood that in other embodiments, the arrangement depicted in FIGS. 4a and 4b could comprise solid-state excitation sources 420 constituted by two or more LEDs rather than a single broadband InGaN/GaN blue LED having an active region with multiple-quantum-wells.

Green to Yellow Photoluminescence Materials

In this patent specification, a green to yellow photoluminescence material refers to a material which generates light having a peak emission wavelength ($\lambda_{pe}$) in a range ~490 nm to ~550 nm, that is in the green to yellow region of the visible spectrum. Preferably, the green to yellow photoluminescence material has a broad emission characteristic and preferably has a FWHM (Full Width Half Maximum) of ~100 nm or wider. The green to yellow photoluminescence material can comprise any photoluminescence material, such as for example, garnet-based inorganic phosphor materials, silicate phosphor materials and oxynitride phosphor materials. Examples of suitable green to yellow phosphors are given in Table 1.

In some embodiments, the green to yellow photoluminescence materials comprises a cerium-activated yttrium aluminum garnet phosphor of general composition $Y_3(Al,Ga)_5O_{12}$:Ce (YAG) such as for example a YAG series phosphor from Intematix Corporation, Fremont Calif., USA which have a peak emission wavelength of in a range 527 nm to 543 nm and a FWHM of ~120 nm. In this patent specification, the notation YAG# represents the phosphor type—YAG-based phosphors—followed by the peak emission wavelength in nanometers (#). For example, YAG535 denotes a YAG phosphor with a peak emission wavelength of 535 nm. The green to yellow photoluminescence material may comprise a cerium-activated yttrium aluminum garnet phosphor of general composition $(Y,Ba)_3(Al,Ga)_5O_{12}$:Ce (YAG) such as for example a GNYAG series phosphor from Intematix Corporation, Fremont Calif., USA. In some embodiments, the green photoluminescence material can comprise an aluminate (LuAG) phosphor of general composition $Lu_3Al_5O_{12}$:Ce (GAL). Examples of such phosphors include for example the GAL series of phosphor from Intematix Corporation, Fremont Calif., USA which have a peak emission wavelength of 516 nm to 560 nm and a FWHM of ~120 nm. In this patent specification, the notation GAL# represents the phosphor type (GAL)-LuAG-based phosphors—followed by the peak emission wavelength in nanometers (#). For example, GAL520 denotes a GAL phosphor with a peak emission wavelength of 520 nm.

Examples of green to yellow silicate phosphors include europium activated ortho-silicate phosphors of general composition $(Ba, Sr)_2SiO_4$: Eu such as for example G, EG, Y and EY series of phosphors from Intematix Corporation, Fremont Calif., USA which have a peak emission wavelength in a range 507 nm to 570 nm and a FWHM of ~70 nm to ~80 nm. In some embodiments, the green to yellow phosphor can comprise a green-emitting oxynitride phosphor as taught in U.S. Pat. No. 8,679,367 entitled "Green-Emitting (Oxy) Nitride-Based Phosphors and Light Emitting Devices Using the Same" which is hereby incorporated in its entirety. Such a green-emitting oxynitride (ON) phosphor can have a general composition $Eu^{2+}:M^{2+}Si_4AlO_xN_{(7-2x/3)}$ where $0.1 \leq x \leq 1.0$ and $M^{2+}$ is one or more divalent metal selected from the group consisting of Mg, Ca, Sr, Ba, and Zn. In this patent specification, the notation ON# represents the phosphor type (oxynitride) followed by the peak emission wavelength ($\lambda_{pe}$) in nanometers (#). For example ON495 denotes a green oxynitride phosphor with a peak emission wavelength of 495 nm.

TABLE 1

Example green to yellow photoluminescence materials

| Phosphor | General Composition | | Wavelength $\lambda_{pe}$ (nm) |
|---|---|---|---|
| YAG (YAG#) | $Y_{3-x}(Al_{1-y}Ga_y)_5O_{12}$:Ce$_x$ | $0.01 < x < 0.2$ & $0 < y < 2.5$ | 520-550 |
| GNYAG (YAG#) | $(Y, Ba)_{3-x}(Al_{1-y}Ga_y)_5O_{12}$:Ce$_x$ | $0.01 < x < 0.2$ & $0 < y < 2.5$ | 520-550 |
| LuAG (GAL#) | $Lu_{3-x}(Al_{1-y}M_y)_5O_{12}$:Ce$_x$ | $0.01 < x < 0.2$ & $0 < y < 1.5$ M = Mg, Ca, Sr, Ba, Ga, | 500-550 |
| LuAG (GAL#) | $Lu_{3-x}(Al_{1-y}Ga_y)_5O_{12}$:Ce$_x$ | $0.01 < x < 0.2$ & $0 < y < 1.5$ | 500-550 |
| Silicate | $A_2SiO_4$:Eu | A = Mg, Ca, Sr, Ba | 500-550 |
| Silicate | $(Sr_{1-x}Ba_x)_2SiO_4$:Eu | $0.3 < x < 0.9$ | 500-550 |
| Oxynitride (ON#) | $Eu^{2+}:M^{2+}Si_4AlO_xN_{(7-2x/3)}$ | $M^{2+}$ = Mg, Ca, Sr, Ba, Zn $0.1 \leq x \leq 1.0$ | 500-550 |

Orange to Red Photoluminescence Materials

The orange to red photoluminescence material can comprise any orange to red photoluminescence material, typically a phosphor, that is excitable by blue light and operable to emit light with a peak emission wavelength $\lambda_{pe}$ in a range about 600 nm to about 670 nm and can include, for example, a europium activated silicon nitride-based phosphor, α-SiAlON, Group IIA/IIB selenide sulfide-based phosphor or silicate-based phosphors. Examples of orange to red phosphors are given in Table 2.

In some embodiments, the europium activated silicon nitride-based phosphor comprises a Calcium Aluminum Silicon Nitride phosphor (CASN) of general formula $CaAlSiN_3$:$Eu^{2+}$. The CASN phosphor can be doped with other elements such as strontium (Sr), general formula $(Sr,Ca)AlSiN_3$:$Eu^{2+}$. In this patent specification, the notation CASN# represents the phosphor type (CASN) followed by the peak emission wavelength ($\lambda_{pe}$) in nanometers (#). For example CASN615 denotes an orange to red CASN phosphor with a peak emission wavelength of 615 nm.

In one embodiment, the orange to red phosphor can comprise an orange to red-emitting phosphor as taught in U.S. Pat. No. 8,597,545 entitled "Red-Emitting Nitride-Based Calcium-Stabilized Phosphors" which is hereby incorporated in its entirety. Such a red emitting phosphor comprises a nitride-based composition represented by the chemical formula $M_aSr_bSi_cAl_dN_eEu_f$, wherein: M is Ca, and $0.1 \leq a \leq 0.4$; $1.5 < b < 2.5$; $4.0 \leq c \leq 5.0$; $0.1 \leq d \leq 0.15$; $7.5 < e < 8.5$; and $0 < f < 0.1$; wherein $a+b+f > 2+d/v$ and v is the valence of M.

Alternatively, the orange to red phosphor can comprise an orange to red emitting nitride-based phosphor as taught in U.S. Pat. No. 8,663,502 entitled "Red-Emitting Nitride-Based Phosphors" which is hereby incorporated in its entirety. Such a red emitting phosphor comprising a nitride-based composition represented by the chemical formula $M_{(x/v)}M'_2Si_{5-x}Al_xN_8$:RE, wherein: M is at least one monovalent, divalent or trivalent metal with valence v; M' is at least one of Mg, Ca, Sr, Ba, and Zn; and RE is at least one of Eu, Ce, Tb, Pr, and Mn; wherein x satisfies $0.1 \leq x \leq 0.4$, and wherein said red-emitting phosphor has the general crystalline structure of $M'_2Si_5N_8$:RE, Al substitutes for Si within said general crystalline structure, and M is located within said general crystalline structure substantially at the interstitial sites. An example of one such a phosphor is XR610 red nitride phosphor from Intematix Corporation, Fremont Calif., USA which has a peak emission wavelength of 610 nm.

Orange to red phosphors can also include Group IIA/IIB selenide sulfide-based phosphors. A first example of a Group IIA/IIB selenide sulfide-based phosphor material has a composition $MSe_{1-x}S_x$:Eu, wherein M is at least one of Mg, Ca, Sr, Ba and Zn and $0 < x < 1.0$. A particular example of this phosphor material is CSS phosphor ($CaSe_{1-x}S_x$:Eu). Details of CSS phosphors are provided in co-pending United States patent application Publication Number US2017/0145309 filed 30 Sep. 2016, which is hereby incorporated by reference in its entirety. The CSS orange to red phosphors described in United States patent publication US2017/0145309 can be used in the present invention. The emission peak wavelength of the CSS phosphor can be tuned from 600 nm to 650 nm by altering the S/Se ratio in the composition and exhibits a narrow-band red emission spectrum with FWHM in the range ~48 nm to ~60 nm (longer peak emission wavelength typically has a larger FWHM value). In this patent specification, the notation CSS# represents the phosphor type (CSS) followed by the peak emission wavelength in nanometers (#). For example CSS615 denotes a CSS phosphor with a peak emission wavelength of 615 nm. To improve reliability, the CSS phosphor particles can be coated with one or more oxides, for example: aluminum oxide ($Al_2O_3$), silicon oxide ($SiO_2$), titanium oxide ($TiO_2$), zinc oxide (ZnO), magnesium oxide (MgO), zirconium oxide ($ZrO_2$), boron oxide ($B_2O_3$) or chromium oxide (CrO). Alternatively and/or in addition, the narrow-band red phosphor particles may be coated with one or more fluorides, for example: calcium fluoride ($CaF_2$), magnesium fluoride ($MgF_2$), zinc fluoride ($ZnF_2$), aluminum fluoride ($AlF_3$) or titanium fluoride ($TiF_4$). The coatings may be a single layer, or multiple layers with combinations of the aforesaid coatings. The combination coatings may be coatings with an abrupt transition between the first and second materials, or may be coatings in which there is a gradual/smooth transition from the first material to the second material thus forming a zone with mixed composition that varies through the thickness of the coating.

In some embodiments, the orange to red phosphor can comprise an orange-emitting silicate-based phosphor as taught in U.S. Pat. No. 7,655,156 entitled "Silicate-Based Orange Phosphors" which is hereby incorporated in its entirety. Such an orange-emitting silicate-based phosphor can have a general composition $(Sr_{1-x}M_x)_yEu_zSiO_5$ where $0<x\leq0.5$, $2.6\leq y\leq3.3$, $0.001\leq z\leq0.5$ and M is one or more divalent metal selected from the group consisting of Ba, Mg, Ca, and Zn. In this patent specification, the notation O# represents the phosphor type (orange silicate) followed by the peak emission wavelength ($\lambda_{pe}$) in nanometers (#). For example, O600 denotes an orange silicate phosphor with a peak emission wavelength of 600 nm.

TABLE 2

Example orange to red photoluminescence materials

| Phosphor | General Composition | | Wavelength $\lambda_{pe}$ (nm) |
|---|---|---|---|
| CASN (CASN#) | $(Ca_{1-x}Sr_x)AlSiN_3$:Eu | $0.5 < x \leq 1$ | 600-620 |
| 258 nitride Group IIA/IIB | $Ba_{2-x}Sr_xSi_5N_8$:Eu | $0 \leq x \leq 2$ | 580-620 |
| Selenide Sulfide (CSS#) | $MSe_{1-x}S_x$:Eu | M = Mg, Ca, Sr, Ba, Zn $0 < x < 1.0$ | 600-650 |
| CSS (CSS#) | $CaSe_{1-x}S_x$:Eu | $0 < x < 1.0$ | 600-650 |
| Silicate (O#) | $(Sr_{1-x}M_x)_yEu_zSiO_5$ | M = Ba, Mg, Ca, Zn $0 < x \leq 0.5$ $2.6 \leq y \leq 3.3$ $0.001 \leq z \leq 0.5$ | 565-600 |

Broadband Blue Solid-State Excitation Sources

As described above, and in accordance with some embodiments of the invention, the broadband blue solid-state excitation source can comprise solid-state light sources (for example LEDs) of two or more different dominant wavelengths.

Figure 5A:
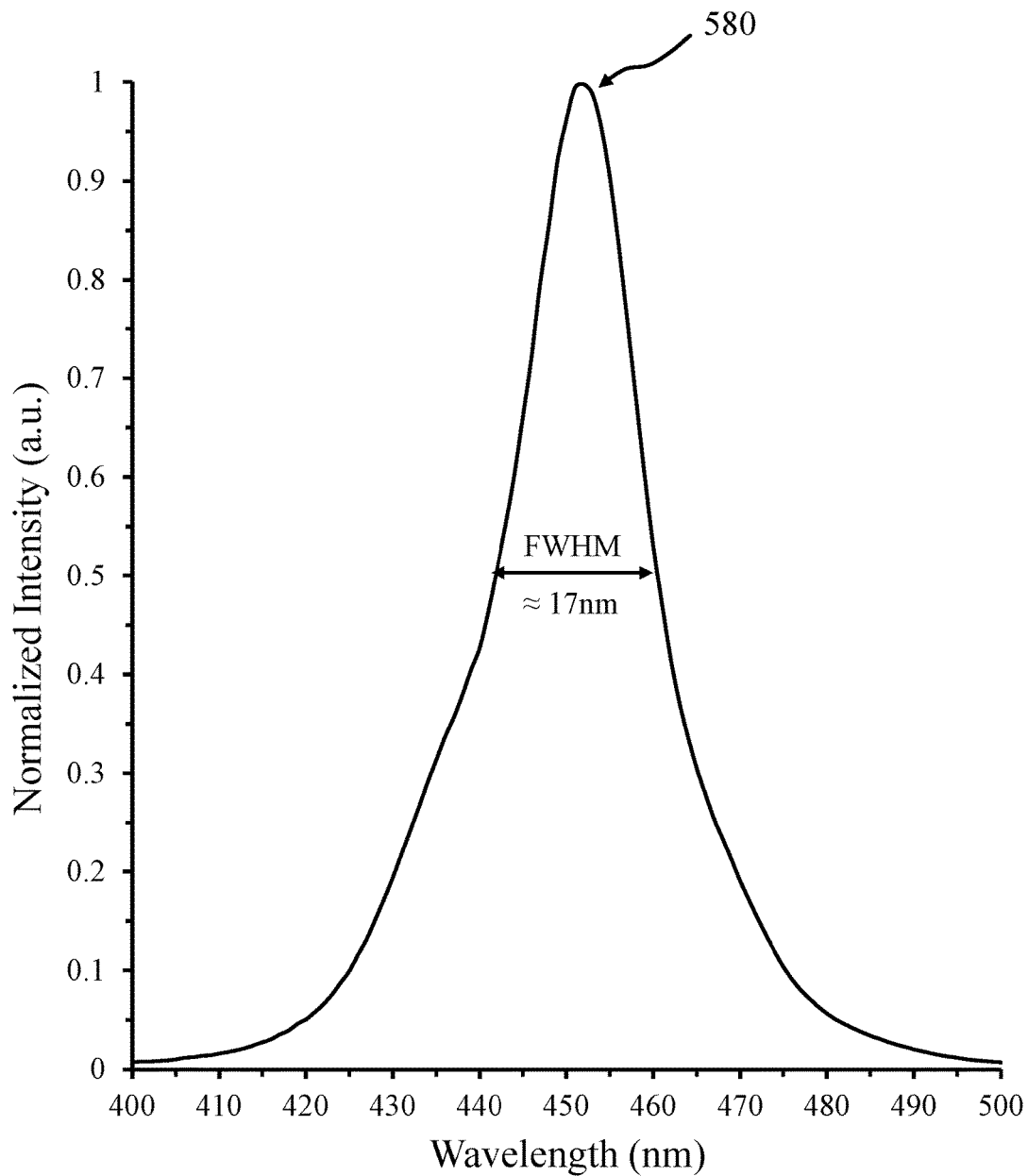
FIG. 5a is an emission spectrum, normalized intensity (a.u.) versus wavelength (nm) for a 454.4 nm narrowband LED (Prior art)
Figure 5B:
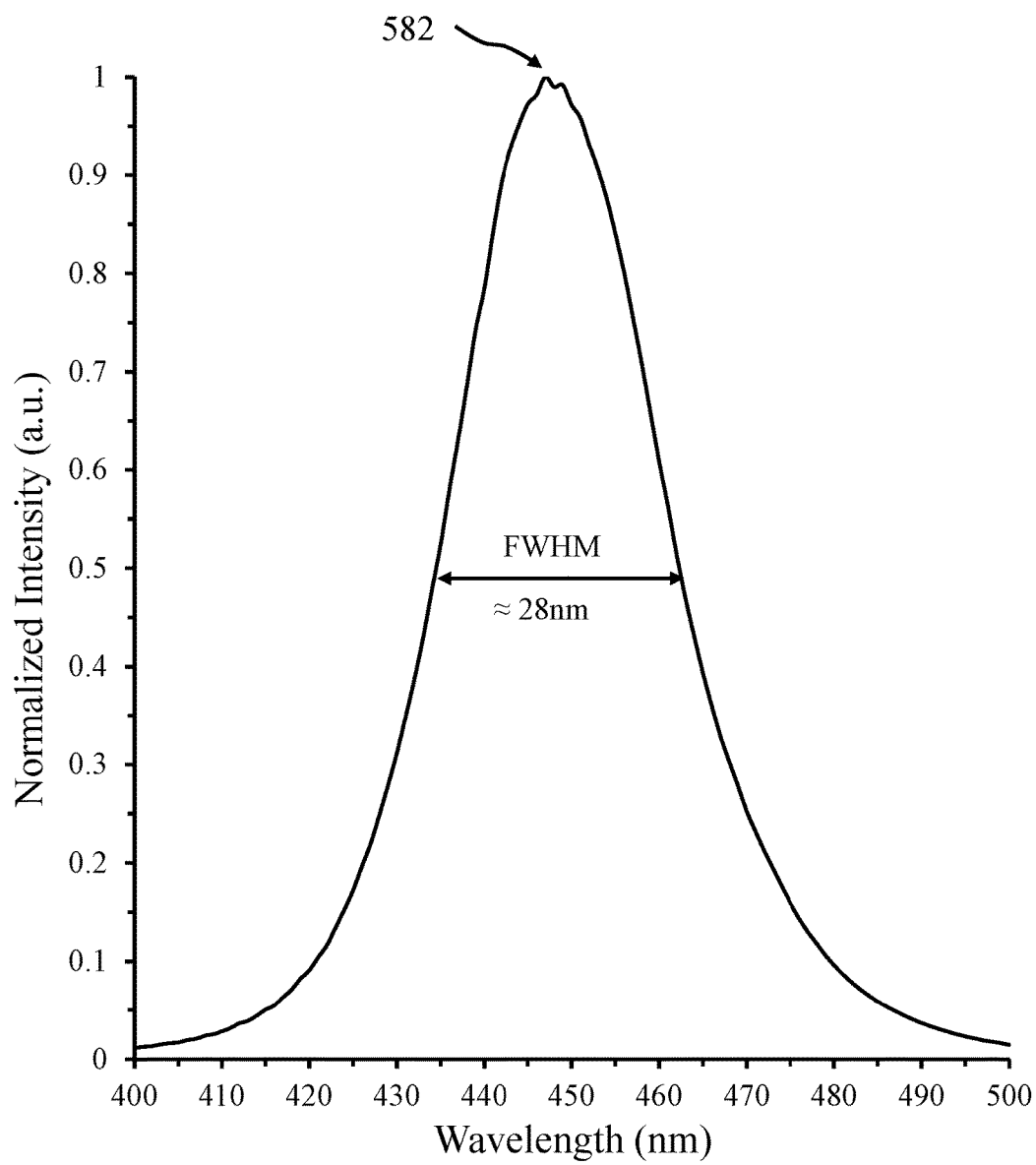
FIG. 5b is an emission spectrum, normalized intensity (a.u.) versus wavelength (nm) for a broadband blue solid-state excitation source in accordance with the invention comprising a combination of two LEDs with dominant wavelengths $\lambda_{d1}$=452 nm and $\lambda_{d2}$=462 nm LEDs.

FIG. 5a is a measured emission spectrum, normalized intensity (a.u.) versus wavelength (nm), for a 454.4 nm narrowband LED (Prior art) and FIG. 5b is a measured emission spectrum, normalized intensity (a.u.) versus wavelength (nm), for a broadband blue solid-state excitation source in accordance with the invention comprising a combination of two LEDs with dominant wavelengths $\lambda_{d1}$=452 nm and $\lambda_{d2}$=462 nm. It can be seen that both emission spectra (FIGS. 5a and 5b) exhibit a single maximum peak 580 and 582 respectively. Comparing the figures visually illustrates the increase in FWHM when using a combination of LEDs with two different dominant wavelengths compared with an LED of a single dominant wavelength. More specifically, for a broadband blue solid-state excitation source in accordance with the invention comprising a combination of LEDs with two different dominant wavelengths ($\lambda_{d1}$=452 nm and $\lambda_{d2}$=462 nm), the dominant wavelength of the excitation light generated by the source is 454.2 nm with a FWHM of about 28 nm. For comparison, a solitary narrowband LED with substantially the same dominant wavelength (454.4 nm) generates light with a FWHM of only 17 nm. As described below, it is the increase in FWHM of the excitation light (i.e. 17 nm to 28 nm) that advantageously gives rise to the enhanced optical performance of light emitting devices in accordance with the invention.

Figure 6:
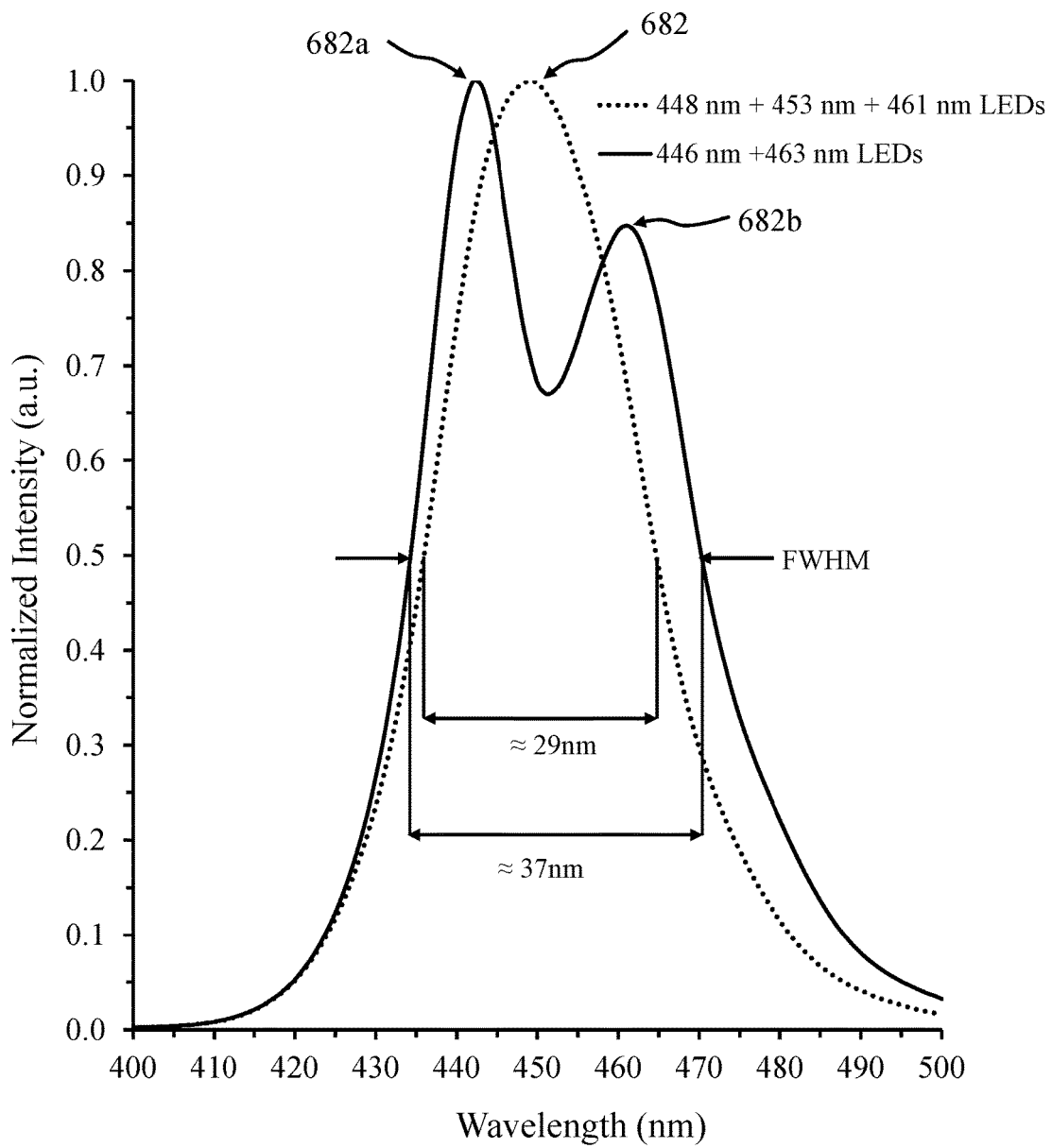
FIG. 6 are emission spectra, normalized intensity (a.u.) versus wavelength (nm) for broadband blue solid-state excitation sources in accordance with the invention comprising (i) a combination of LEDs with two different dominant wavelengths $\lambda_{d1}$=446 nm and $\lambda_{d2}$=463 nm and (ii) a combination of LEDs with three different dominant wavelengths $\lambda_{d1}$=448 nm, $\lambda_{d2}$=453 nm and $\lambda_{d3}$=461 nm.

In further embodiments, the broadband blue solid-state excitation source can comprise solid-state light sources (for example LEDs) with three or more different dominant wavelengths. FIG. 6 shows measured emission spectra, normalized intensity (a.u.) versus wavelength (nm), for broadband blue excitation sources in accordance with the invention comprising (i) a combination of blue LEDs with two different dominant wavelengths $\lambda_{d1}$=446 nm and $\lambda_{d2}$=463 nm (solid line) and (ii) a combination of blue LEDs with three different dominant wavelengths $\lambda_{d1}$=448 nm, $\lambda_{d2}$=453 nm and $\lambda_{d3}$=461 nm (dotted line). FIG. 6 visually indicates the effect of using a combination of LEDs with three different dominant wavelengths compared with an excitation source comprising a combination of LEDs with two different dominant wavelengths. For a solid-state excitation source comprising a combination of LEDs with two different dominant wavelengths ($\lambda_{d1}$=446 nm and $\lambda_{d2}$=463 nm), the dominant wavelength of the excitation light generated by the source is 458.7 nm with a FWHM of 37.4 nm. However, as will be noted in FIG. 6, the excitation source comprising LEDs with two different dominant wavelengths generates excitation light whose spectrum exhibits two distinct peaks 682a, 682b. The FWHM of the excitation source is defined as the wavelength range corresponding to half of the maximum peak. For comparison, an excitation source comprising a combination of LEDs with three different dominant wavelengths generates excitation light with a dominant wavelength of 455.6 nm and has a FWHM of 29.3 nm. However, as will be noted in FIG. 6, the excitation source comprising LEDs with three different dominant wavelengths generates excitation light whose spectrum exhibits a single peak 682. Exhibiting a single peak compared with a dual peak can be attributed to the LEDs having a smaller range in wavelength; that is 448 nm-461 nm compared with 446 nm-463 nm.

Figure 7:
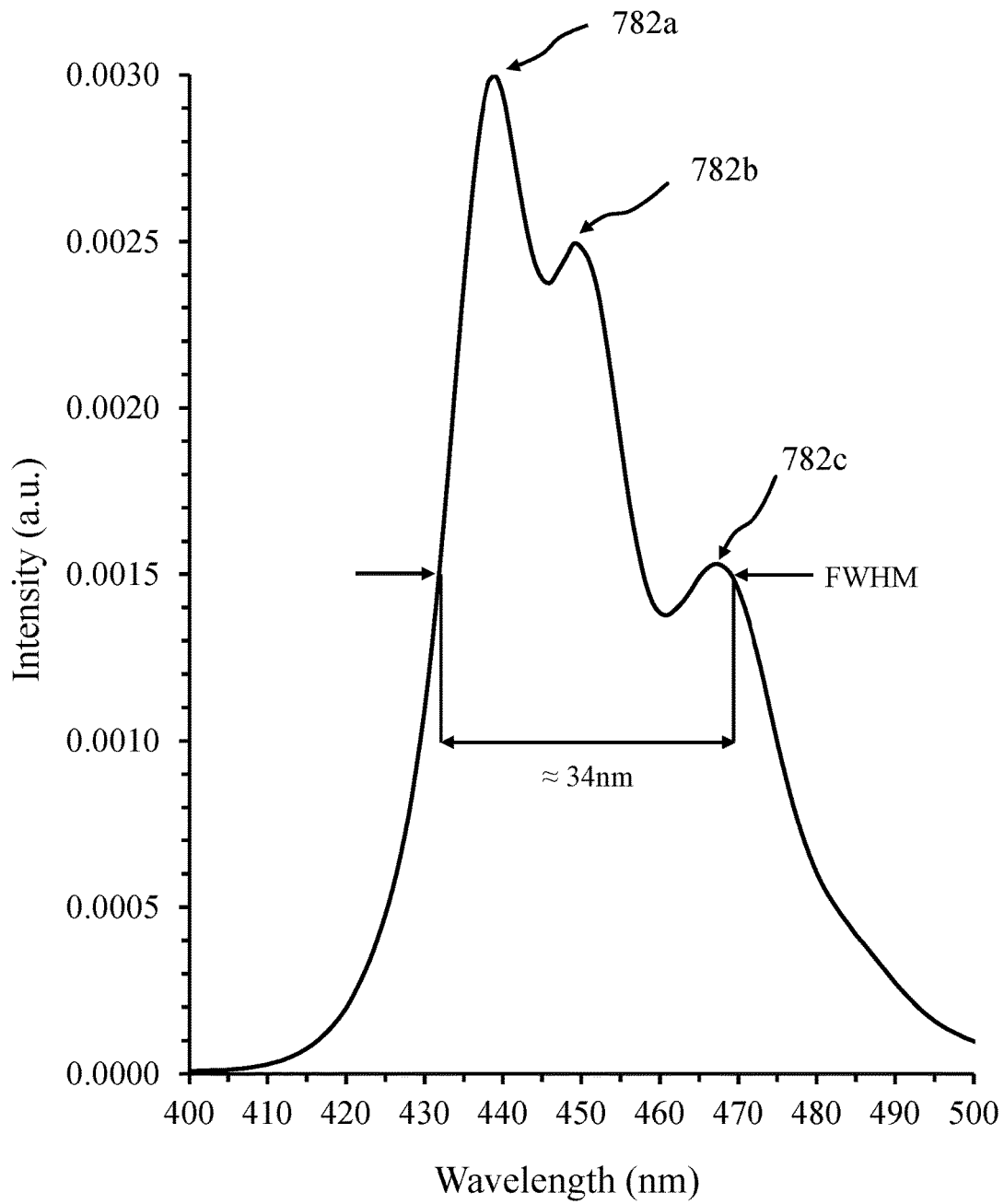
FIG. 7 are emission spectra, normalized intensity (a.u.) versus wavelength (nm) for a broadband blue solid-state excitation source comprising a broadband Multiple-Quantum-Well LED.

As described above, and in accordance with some embodiments of the invention, the broadband blue solid-state excitation source can comprise one or more broadband blue solid-state light sources (for example MQW LED chips). FIG. 7 shows measured emission spectrum, normalized intensity (a.u.) versus wavelength (nm) for an broadband blue excitation source comprising a broadband MQW LED. The MQW LED comprises nine quantum wells and generates light with a FWHM 34 nm, thus falling within the FWHM range of 25 nm to 50 nm in accordance with the invention. As depicted in FIG. 7, the spectrum exhibits three peaks 782a, 782b and 782c which is attributable to the multiple different quantum wells generating three different peak wavelengths (blue light emissions).

Remote Phosphor White Light Emitting Device Test Method

The remote phosphor test method involves measuring total light emission of a remote phosphor white light emitting device (FIGS. 1a and 1b) in an integrating sphere.

The photoluminescence wavelength conversion component (128—FIGS. 1a and 1b) comprises φ φ 61.5 mm diameter circular borosilicate glass disc. The phosphor materials are mixed with an optical encapsulant OE6370 from Dow Corning (silicone resin) and the resulting mixture applied as a layer to one face of the glass disc and cured.

In this specification, the following nomenclature is used to denote remote phosphor light emitting devices: Com.# denotes a comparative light emitting device in which each excitation source comprises one or more solid-state light sources of a single dominant wavelength and Dev.# denotes a light emitting device in accordance with an embodiment of the invention in which each excitation source comprises solid-state light sources of two different dominant wavelengths. Comparative light emitting devices (Com.#) comprise eight solid-state excitation sources each of which comprises a 454.4 nm, 2835 packaged LED chip. Therefore, Com.# comprises a total of eight LED chips. Light emitting devices in accordance with the invention (Dev.#) comprise six solid-state excitation sources (220—FIG. 2a) each of which comprises a 2835 package containing two LED chips of dominant wavelength $\lambda_{d1}$=452 nm and $\lambda_2$=464 nm. Therefore, Dev.# comprises a total of twelve LED chips.

2700K to 3000K Full Spectrum White Light Emitting Devices

Table 4 tabulates phosphor compositions for nominal 2700K light emitting devices for a comparative device denoted Com.1 and a remote phosphor full spectrum white light emitting device in accordance with the invention, denoted Dev. 1.

As can be seen from Table 4, in terms of phosphor composition: Com.1 and Dev. 1 each comprise 1.1 wt % ON495 ($Eu^{2+}$:$M^{2+}Si_4AlO_xN_{(7-2x/3)}$–$\lambda_{pe}$=495 nm), 88.4 wt % GAL520 ($Lu_{3-x}(Al_{1-y}Ga_y)_5O_{12}$:$Ce_x$–$\lambda_{pe}$=520 nm), 5.8 wt % O600 (($Sr_{1-x}M_x)_yEu_zSiO_5$–$\lambda_{pe}$=600 nm) and 4.7 wt % CASN670 ($Ca_{1-x}Sr_xAlSiN_3$:Eu–$\lambda_{pe}$=670 nm). As described above, Com.1 comprises eight solid-state excitation sources each of which comprises a 454.4 nm, 2835 packaged LED chip, while Dev. 1 comprises six broadband blue solid-state excitation sources each of which comprises a 2835 package containing two LED chips of dominant wavelength $\lambda_{d1}$=452 nm and $\lambda_{d2}$=464 nm.

TABLE 4

2700K light emitting device phosphor composition

| | Phosphor composition (wt. %) | | | |
|---|---|---|---|---|
| | Green to Yellow | | Orange to Red | |
| Device | ON495 | GAL520 | O600 | CASN670 |
| Com. 1 | 1.1 | 88.4 | 5.8 | 4.7 |
| Dev. 1 | 1.1 | 88.4 | 5.8 | 4.7 |

Tables 5, 6 and 7 tabulates measured optical test data for light emitting devices Com.1 and Dev.1 and illustrate the effect on light emitting device optical performance of using a broadband blue solid-state excitation source in accordance with the invention comprising a combination of two or more solid-state LEDs of different dominant wavelengths ($\lambda_{d1}$=452 nm and $\lambda_{d2}$=464 nm) compared with using a solid-state excitation source comprising solid-state LEDs of a single dominant wavelength ($\lambda_d$=454 nm). It is to be noted from these tables that device Dev. 1 produces white light in which (i) each of CRI R1 to CRI R15 is 97 or higher, (ii) there is a substantial increase in CRI R11 ("Saturated Green")—98.9 compared with 97.9, (iii) there is a substantial increase in CRI R12 ("Saturated Blue")—97.5 compared with 91.9, (iv) there is a substantial increase in general color rendering index CRI Ra—99.0 compared with 98.1, (v) there is a substantial increase in color rendering index CRI Rall (average of R1 to R15)—99.0 compared with 97.5, (vi) there is a substantial increase in IEC TM-30 fidelity index $R_f$—97.6 compared with 96.4. Further, it is to be noted that while the invention results in a substantial increase in the quality (color rendering) of light, there is only a small reduction 1.8% in luminous efficacy LE, and Dev.1 has a high luminous efficacy LE of 224.1 lm/$W_{opt}$.

TABLE 5

2700K light emitting device-Measured test data

| Device | LE (lm/$W_{opt}$) | LE (%) | CIE x | CIE y | CCT (K) |
|---|---|---|---|---|---|
| Com. 1 | 228.2 | 100.0 | 0.4540 | 0.4086 | 2768 |
| Dev. 1 | 224.1 | 98.2 | 0.4578 | 0.4071 | 2701 |

TABLE 6

2700K light emitting device - Measured test data

| | CIE Color Rendering CRI | | | | | | | | |
|---|---|---|---|---|---|---|---|---|---|
| Device | R1 | R2 | R3 | R4 | R5 | R6 | R7 | R8 | R9 |
| Com.1 | 97.8 | 98.6 | 98.3 | 97.7 | 97.8 | 97.6 | 99.0 | 98.4 | 96.9 |
| Dev.1 | 99.0 | 99.6 | 99.2 | 98.6 | 99.3 | 99.0 | 98.7 | 99.0 | 99.3 |

TABLE 7

| | 2700K light emitting device - Measured test data | | | | | | | | | |
|---|---|---|---|---|---|---|---|---|---|---|
| | CIE Color Rendering CRI | | | | | | | | IES TM-30-15 | |
| Device | R10 | R11 | R12 | R13 | R14 | R15 | Ra | Rall | $R_f$ | $R_g$ |
| Com.1 | 96.9 | 97.9 | 91.9 | 97.8 | 98.7 | 98.2 | 98.1 | 97.5 | 96.4 | 100.5 |
| Dev.1 | 99.2 | 98.9 | 97.5 | 99.0 | 99.2 | 99.5 | 99.0 | 99.0 | 97.6 | 101.2 |

Figure 8:
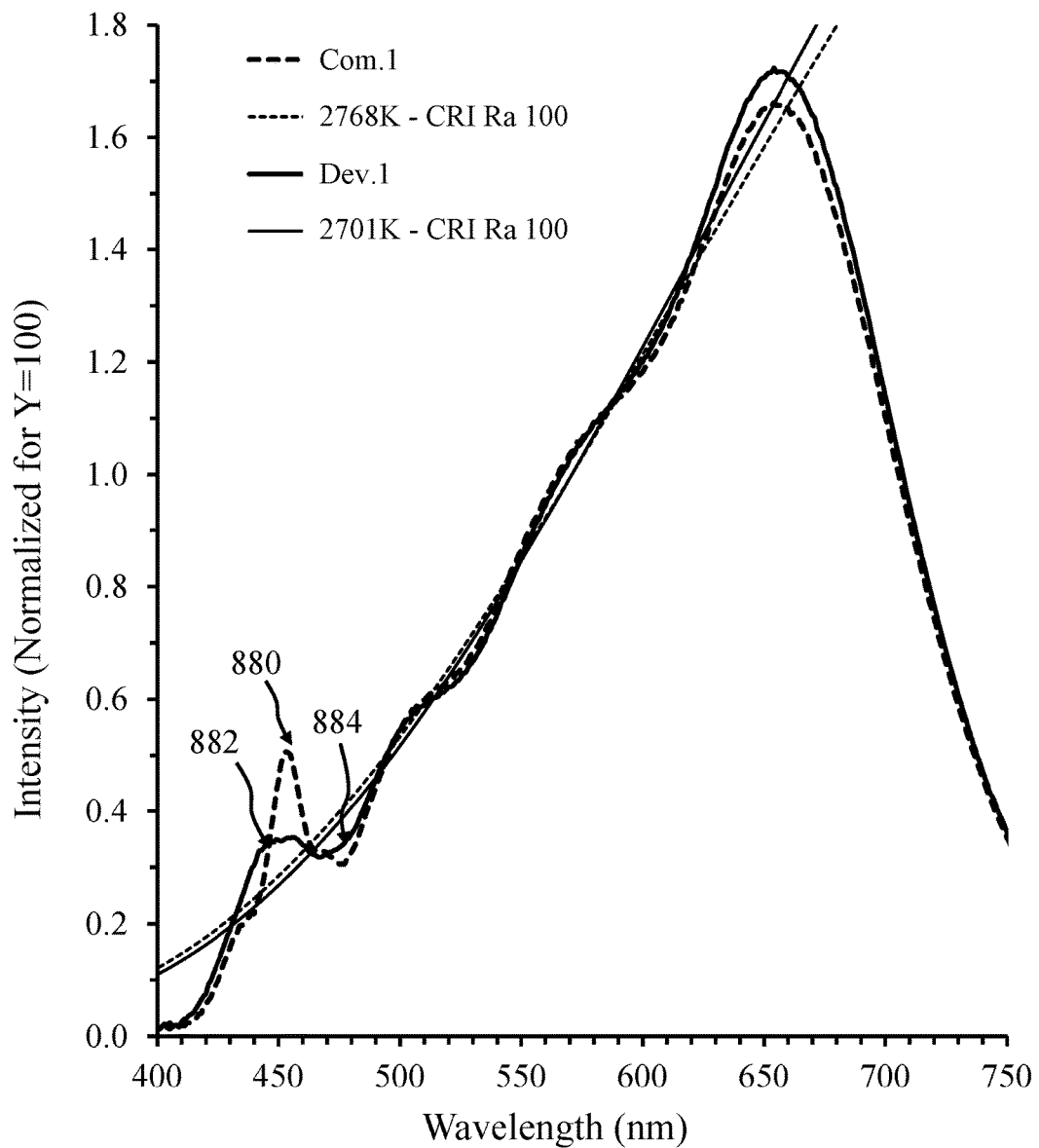
FIG. 8 are emission spectra, normalized intensity (normalized to a CIE 1931 XYZ relative luminance Y=100) versus wavelength (nm) for (i) Dev. 1 (thick solid line), (ii) Com. 1 (dashed line), (iii) Planckian spectrum (thin solid line) for a CCT that is the same as that of Dev.1 (2701 K), and (iv) Planckian spectrum (dotted line) for a CCT that is the same as that of Com. 1 (2768 K)

FIG. 8 shows normalized intensity versus wavelength (nm) for (i) Dev. 1 (thick solid line), (ii) Com. 1 (dashed line), (iii) Planckian spectrum (thin solid line) for a CCT that is the same as that of Dev.1 (2701 K), and (iv) Planckian spectrum (dotted line) for a CCT that is the same as that of Com. 1 (2768 K). To make a meaningful comparison of the spectra, each spectra has been normalized such each has a CIE 1931 XYZ relative luminance Y=100. The data are normalized using the CIE 1931 luminosity function y(λ) of a standard observer which takes account of the photopic response of an observer. The Planckian spectrum (curve) or black-body spectra in FIG. 8 represents the spectrum for a General CRI Ra equal to 100 for a given color temperature (CCT). Accordingly, for a white light emitting device of a given color temperature to have the highest color rendering possible, its emission spectrum should match as closely as possible the black-body spectrum of the same color temperature.

Referring to FIG. 8, it will be noted that the most pronounced effect on the emission spectral energy content—of the device in accordance with the invention (i.e. broadband blue excitation source comprising two solid-state light sources with different dominant wavelengths) compared with the comparative device (i.e. excitation source comprising solid-state light sources with a single dominant wavelength) are: (i) a reduction in the intensity of the blue emission peak 882 and (ii) a decrease in trough (valley) 884 in the cyan region of the spectrum at about 480 nm. As can be seen from the figure, the reduction of the blue emission peak 882 of Dev. 1 (compared with peak 880 of Com. 1) and decrease in trough 884 results in the emission spectrum more closely resembling the Planckian spectrum, that is more closely resembling natural sunlight. It is believed that this change in spectral energy content resulting from the use of a broadband blue excitation source, in this embodiment comprising two solid-state light sources, with different dominant wavelengths (blue light emissions) partially fills the trough in the cyan region of the spectrum accounts for the superior color rendering properties of the devices of the invention; in particular, the increase in CIE CRI R11 and CRI R12, General CRI Ra and IEC TM-30 fidelity index $R_f$.

A further advantage of the present invention is that white light emitting devices according to the invention can reduce or possibly prevent the likelihood of damage to the human retina and macula by reducing High Energy Visible (HEV) blue light in the wavelength region 400-500 nm. The blue photon energy (area under the peak) for the blue peaks 880 (Com.1) and 882 (Dev.1) are substantially the same. However, in the case of the peak 882 this energy is distributed over a greater wavelength range thereby reducing the intensity of the blue peak compared with the peak 882. Since the white light emitting device of the present invention exhibits a reduction in the blue emission peak (i.e. HEV), the likelihood of damage being caused to the human retina and degeneration of the human macula is reduced or prevented.

3500K to 4000K Light Emitting Devices

Table 8 tabulates phosphor compositions for nominal 3800K light emitting devices for a comparative device denoted Com.2 and a remote phosphor light emitting device in accordance with the invention, denoted Dev.2.

As can be seen from Table 8, in terms of phosphor composition: Com.2 comprises 93.1 wt % GAL520 ($Lu_{3-x}(Al_{1-y}Ga_y)_5O_{12}:Ce_x$–$\lambda_{pe}$=520 nm), 2.4 wt % CASN628 ($Ca_{1-x}Sr_xAlSiN_3:Eu$–$\lambda_{pe}$=628 nm) and 4.5 wt % CASN670 ($Ca_{1-x}Sr_xAlSiN_3:Eu$ $\lambda_{pe}$=670 nm) while Dev.2 comprises 93.5 wt % GAL520, 2.3 wt % CASN628 and 4.2 wt % CASN670. As described above, Com.2 comprises eight solid-state excitation sources each of which comprises a 454.4 nm, 2835 packaged LED chip, while Dev.2 comprises six broadband blue solid-state excitation sources each of which comprises a 2835 package containing two LED chips of dominant wavelength $\lambda_{d1}$=452 nm and $\lambda_{d2}$=464 nm.

TABLE 8

| 3800K light emitting device phosphor composition | | | |
|---|---|---|---|
| | Phosphor composition (wt. %) | | |
| | Green to Yellow | Orange to Red | |
| Device | GAL520 | CASN628 | CASN670 |
| Com. 2 | 93.1 | 2.4 | 4.5 |
| Dev. 2 | 93.5 | 2.3 | 4.2 |

Tables 9, 10 and 11 tabulates measured optical test data for light emitting devices Com.2 and Dev.2 and illustrate the effect on light emitting device optical performance of using a broadband blue excitation source in accordance with the invention comprising a combination of two or more solid-state LEDs of different dominant wavelengths ($\lambda_{d1}$=452 nm and $\lambda_{d2}1$=464 nm) compared with using an excitation comprising solid-state LEDs of a single dominant wavelengths ($\lambda_d$=454 nm). It is to be noted from these tables that device Dev.2 produces white light in which (i) each of CRI R1 to CRI R15 is 90 or higher having (ii) there is an increase in CRI R11 ("Saturated Green")—97.2 compared with 97.0 (ii) there is a substantial increase in CRI R12 ("Saturated Blue")—91.0 compared with 85.3 and (ii) a substantial increase in IEC TM-30 fidelity index $R_f$— 96.9 compared with 95.4. Further it is to be noted, that while the invention results in a substantial increase in the quality (color rendering) of light, there is no reduction in luminous efficacy LE—rather, there is an increase of 0.3% in luminous efficacy LE and Dev.2 has a high luminous efficacy (LE) of 256.0 $lm/W_{opt}$.

TABLE 9

| 3800K light emitting device-Measured test data | | | | | |
|---|---|---|---|---|---|
| Device | LE ($lm/W_{opt}$) | LE (%) | CIE x | CIE y | CCT (K) |
| Com. 2 | 255.3 | 100.0 | 0.3901 | 0.3848 | 3810 |
| Dev. 2 | 256.0 | 100.3 | 0.3882 | 0.3862 | 3867 |

TABLE 10

3800K light emitting device - Measured test data

| | CIE Color Rendering CRI | | | | | | | | |
|---|---|---|---|---|---|---|---|---|---|
| Device | R1 | R2 | R3 | R4 | R5 | R6 | R7 | R8 | R9 |
| Com.2 | 99.3 | 98.9 | 96.3 | 98.7 | 99.4 | 97.4 | 98.5 | 97.4 | 95.2 |
| Dev.2 | 99.6 | 98.5 | 96.4 | 98.4 | 99.4 | 97.7 | 98.1 | 97.7 | 96.6 |

TABLE 11

3800K light emitting device - Measured test data

| | CIE Color Rendering CRI | | | | | | | IES TM-30-15 | |
|---|---|---|---|---|---|---|---|---|---|
| Device | R10 | R11 | R12 | R13 | R14 | R15 | Ra | Rall | $R_f$ | $R_g$ |
| Com.2 | 97.1 | 97.0 | 85.3 | 99.3 | 97.6 | 98.1 | 98.2 | 97.0 | 95.4 | 100.8 |
| Dev.2 | 96.6 | 97.2 | 91.0 | 99.0 | 97.8 | 99.1 | 98.2 | 97.4 | 96.9 | 100.8 |

Figure 9:
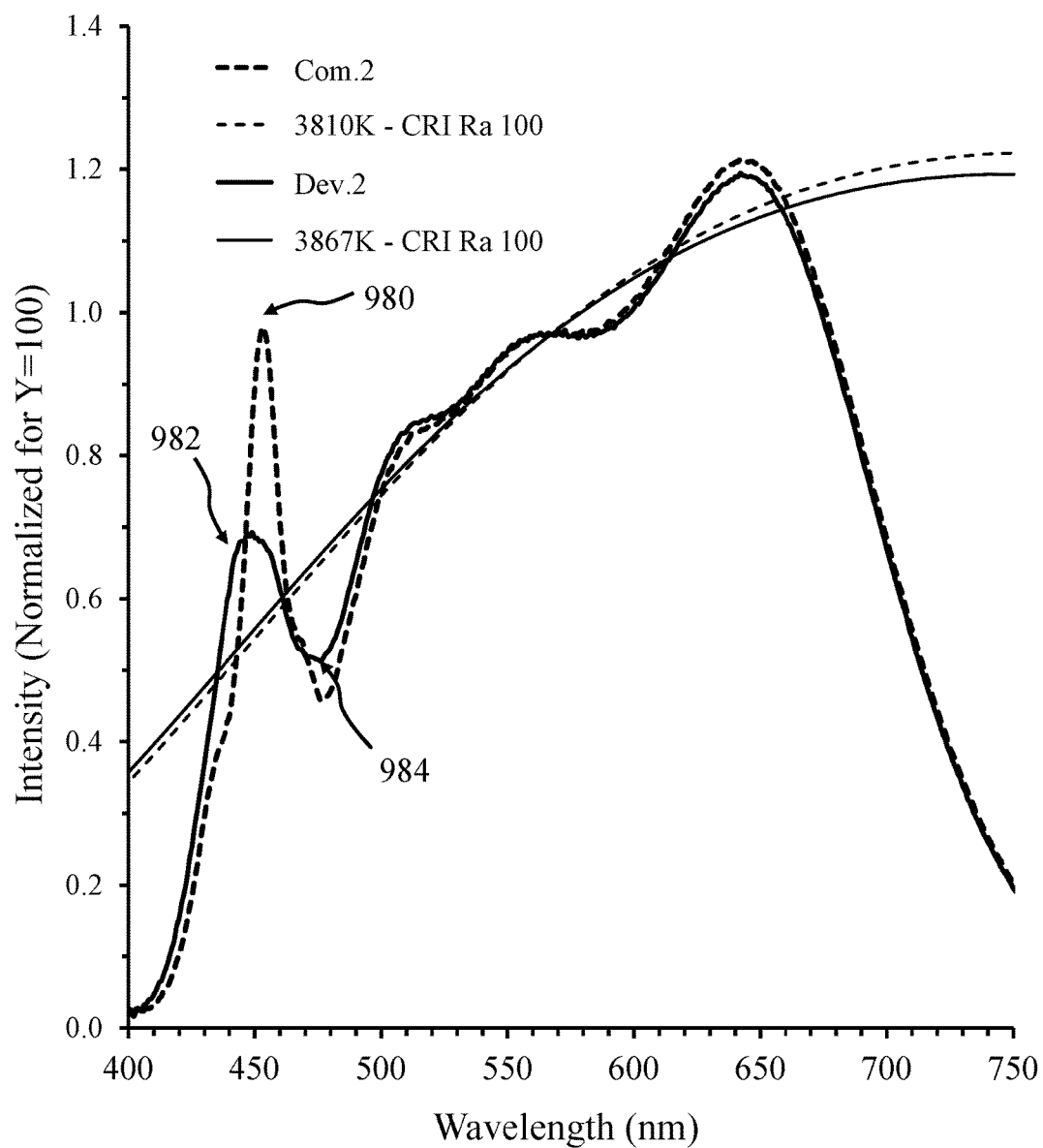
FIG. 9 are emission spectra, normalized intensity (normalized to a CIE 1931 XYZ relative luminance Y=100) versus wavelength (nm) for (i) Dev. 2 (thick solid line), (ii) Com.2 (dashed line), (iii) Planckian spectrum (thin solid line) for a CCT that is the same as that of Dev.2 (3867 K), and (iv) Planckian spectrum (dotted line) for a CCT that is the same as that of Com. 2 (3810 K)

FIG. 9 shows normalized intensity versus wavelength (nm) for (i) Dev. 2 (thick solid line), (ii) Com. 2 (dashed line), (iii) Planckian spectrum (thin solid line) for a CCT that is the same as that of Dev.1 (3867 K), and (iv) Planckian spectrum (dotted line) for a CCT that is the same as that of Com.1 (3810 K). Referring to FIG. 9, it will be noted that the most pronounced effect on the emission spectra—spectral energy content—of the device in accordance with the invention (i.e. broadband blue solid-state excitation source comprising two solid-state light sources with different dominant wavelengths) compared with the comparative device (i.e. excitation source comprising solid-state light sources with a single dominant wavelength) are: (i) a reduction in the intensity of the blue emission peak 982 and (ii) a decrease in trough 984 in the cyan region of the spectrum at about 480 nm. As can be seen from the figure, the reduction of the blue emission peak 982 of Dev.2 (compared with peak 980 of Com.2) and decrease in trough 984 results in the emission spectrum more closely resembling the Planckian spectrum, that is more closely resembling natural sunlight. It is believed that this change in spectral energy content resulting from the use of a broadband blue excitation source, in this embodiment comprising two solid-state light sources, with different dominant wavelengths (blue light emissions) partially fills the trough in the cyan region of the spectrum accounts for the superior color rendering properties of the devices of the invention; in particular, the increase in CRI R12, General CRI Ra and IEC TM-30 fidelity index $R_f$.

A further advantage of the present invention is that white light emitting devices according to the invention can reduce or possibly prevent the likelihood of damage to the human retina and macula by reducing High Energy Visible (HEV) blue light in the wavelength region 400-500 nm. The blue photon energy (area under the peak) for the blue peaks 980 (Com.2) and 982 (Dev.2) are substantially the same. However, in the case of the peak 982 this energy is distributed over a greater wavelength range thereby reducing the intensity of the blue peak compared with the peak 982. Since the white light emitting device of the present invention exhibits a reduction in the blue emission peak (i.e. HEV), the likelihood of damage being caused to the human retina and degeneration of the human macula is reduced or prevented.

4200K to 4500K Light Emitting Devices

Table 12 tabulates phosphor compositions for nominal 4200K light emitting devices for a comparative device denoted Com.3 and a remote phosphor light emitting device in accordance with the invention, denoted Dev.3.

As can be seen from Table 12, in terms of phosphor composition: Com.3 comprises 93.4 wt % GAL520, 2.3 wt % CASN628 and 4.3 wt % CASN670 while Dev.3 comprises 93.5 wt % GAL520, 2.3 wt % CASN628 and 4.2 wt % CASN670. As described above, Com.3 comprises eight solid-state excitation sources each of which comprises a 454.4 nm, 2835 packaged LED chip, while Dev.3 comprises six broadband blue solid-state excitation sources each of which comprises a 2835 package containing two LED chips of dominant wavelength $\lambda_{d1}$=452 nm and $\lambda_{d2}$=464 nm.

TABLE 12

4200K light emitting device phosphor composition

| | Phosphor composition (wt. %) | | |
|---|---|---|---|
| | Green to Yellow | Orange to Red | |
| Device | GAL520 | CASN628 | CASN670 |
| Com. 3 | 93.4 | 2.3 | 4.3 |
| Dev. 3 | 93.5 | 2.3 | 4.2 |

Tables 13, 14 and 15 tabulates measured optical test data for light emitting devices Com.3 and Dev.3 and illustrate the effect on light emitting device optical performance of using a broadband blue excitation source comprising a combination of two or more solid-state LEDs of different dominant wavelengths ($\lambda_{d1}$=452 nm and $\lambda_{d2}$=464 nm) compared with using an excitation comprising solid-state LEDs of a single dominant wavelengths ($\lambda_d$=454 nm). It is to be noted from these tables that device Dev.3 produces white light in which (i) each of CRI R1 to CRI R15 is 90 or higher, (ii) there is a substantial increase in (i) CRI R12 ("Saturated Blue")— 90.1 compared with 82.3 and (iii) there is a substantial increase in IEC TM-30 fidelity index $R_f$— 96.4 compared with 94.7. Further, it is to be noted that while the invention results in a substantial increase in the quality (color rendering) of light, there is only a very small reduction (0.9%) in luminous efficacy LE and the device has a high luminous efficacy of 254.6 lm/$W_{opt}$.

TABLE 13

4200K light emitting device-Measured test data

| Device | LE (lm/$W_{opt}$) | LE (%) | CIE x | CIE y | CCT (K) |
|---|---|---|---|---|---|
| Com. 3 | 257.0 | 100.0 | 0.3734 | 0.3732 | 4173 |
| Dev. 3 | 254.6 | 99.1 | 0.3731 | 0.3718 | 4172 |

TABLE 14

4200K light emitting device - Measured test data

| | CIE Color Rendering CRI | | | | | | | | |
|---|---|---|---|---|---|---|---|---|---|
| Device | R1 | R2 | R3 | R4 | R5 | R6 | R7 | R8 | R9 |
| Com.3 | 99.4 | 98.4 | 95.8 | 98.8 | 98.6 | 96.1 | 98.6 | 97.8 | 95.9 |
| Dev.3 | 99.3 | 99.0 | 96.1 | 97.7 | 99.9 | 97.4 | 96.8 | 96.7 | 93.5 |

TABLE 15

4200K light emitting device - Measured test data

| | CIE Color Rendering CRI | | | | | | | IES TM-30-15 | |
|---|---|---|---|---|---|---|---|---|---|
| Device | R10 | R11 | R12 | R13 | R14 | R15 | Ra | Rall | $R_f$ | $R_g$ |
| Com.3 | 95.7 | 97.2 | 82.3 | 99.1 | 97.4 | 98.1 | 98.0 | 96.5 | 94.7 | 100.9 |
| Dev.3 | 97.2 | 96.4 | 90.1 | 99.5 | 97.6 | 98.2 | 98.0 | 97.0 | 96.4 | 101.5 |

Figure 10:
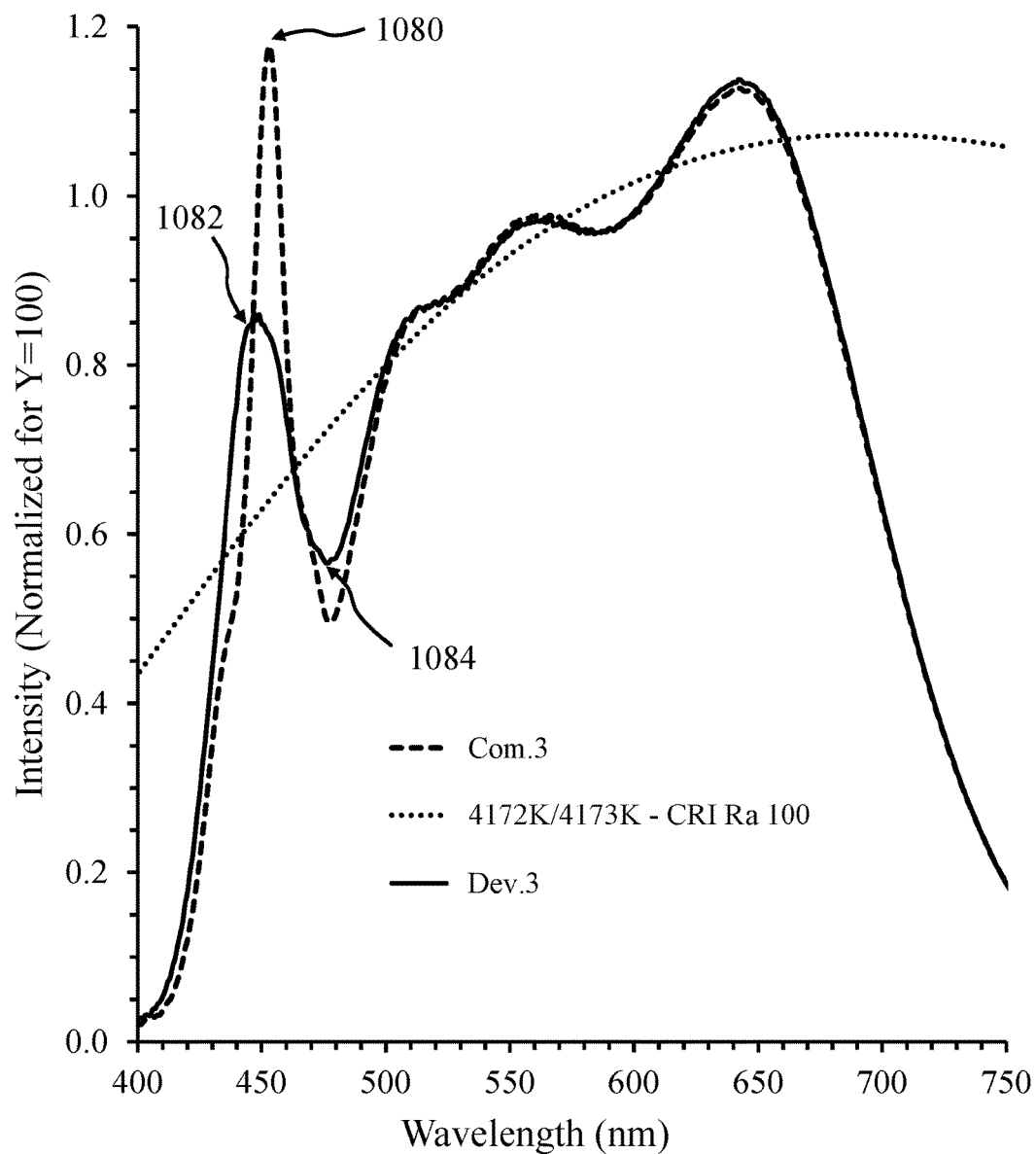
FIG. 10 are emission spectra, normalized intensity (normalized to a CIE 1931 XYZ relative luminance Y=100) versus wavelength (nm) for (i) Dev. 3 (thick solid line), (ii) Com. 3 (dashed line), (iii) Planckian spectrum (thin solid line) for a CCT that is the same as that of Dev.3 (4172 K), and (iv) Planckian spectrum (dotted line) for a CCT that is the same as that of Com. 3 (4173 K)

FIG. 10 shows normalized intensity versus wavelength (nm) for (i) Dev. 3 (thick solid line), (ii) Com. 3 (dashed line), (iii) Planckian spectrum (thin solid line) for a CCT that is the same as that of Dev.3 (4172 K), and (iv) Planckian spectrum (dotted line) for a CCT that is the same as that of Com.1 (4173 K). Referring to FIG. 10, it will be noted that the most pronounced effect on the emission spectra—spectral energy content—of the device in accordance with the invention (i.e. broadband blue excitation source comprising two solid-state light sources with different dominant wavelengths) compared with the comparative device (i.e. excitation source comprising solid-state light sources with a single dominant wavelength) are: (i) a reduction in blue emission peak 1082 and (ii) a decrease in trough 1084 in the cyan region of the spectrum at about 480 nm. As can be seen from the figure, the reduction of the blue emission peak 1082 of Dev.3 (compared with peak 1080 of Com.3) and decrease in trough 1084 results in the emission spectrum more closely resembling the Planckian spectrum. It is believed that this change in spectral energy content resulting from the use of a broadband blue excitation source, in this embodiment comprising two solid-state light sources, with different dominant wavelengths accounts for the superior color rendering properties of the devices of the invention; in particular, the increase in CRI R12, and IEC TM-30 fidelity index $R_f$.

As with other embodiments of the invention, a further advantage of full spectrum white light of the invention is that they can reduce or possibly prevent the likelihood of damage to the human retina and macula by reducing High Energy Visible (HEV) blue light in the wavelength region 400-500 nm. The blue photon energy (area under the peak) for the blue peaks 1080 (Com.3) and 1082 (Dev.3) are substantially the same. However, in the case of the peak 1082 this energy is distributed over a greater wavelength range thereby reducing the intensity of the blue peak compared with the peak 1082. Since the white light emitting device of the present invention exhibits a reduction in the blue emission peak (i.e. HEV), the likelihood of damage being caused to the human retina and degeneration of the human macula is reduced or prevented.

Packaged White Light Emitting Device Test Method

The packaged test method involves measuring total light emission of a packaged white light emitting device (FIG. 3a) in an integrating sphere.

Packaged full spectrum white light emitting devices in accordance with the invention (Dev.#) each comprise a 2835 (2.8 mm×3.5 mm) SMD package containing solid-state light sources of two or three different dominant wavelengths. Light emitting devices in accordance with the invention Dev.4 comprise a 2835 SMD package containing two 1133 (11 mil by 33 mm) LED chips of dominant wavelength $\lambda_{d1}=446$ nm and $\lambda_{d2}=463$ nm while Dev.5 comprises a 2835 SMD package containing three 1133 LED chips of dominant wavelength $\lambda_{d1}=448$ nm, $\lambda_{d2}=453$ nm and $3=461$ nm.

5000K Packaged White Light Emitting Devices

Table 16 tabulates phosphor compositions for nominal 5000K light emitting devices for packaged white light emitting devices in accordance with the invention, denoted Dev.4 and Dev.5.

As can be seen from Table 16, in terms of phosphor composition: Dev.4 comprises 78.1 wt % GAL520 (Lu$_{3-x}$(Al$_{1-y}$Ga$_y$)$_5$O$_{12}$:Ce$_x$-$\lambda_{pe}$=520 nm), 12.9 wt % GAL484 ($\lambda_{pe}$=484 nm), and 9.0 wt % CASN650 (Ca$_{1-x}$Sr$_x$AlSiN$_3$:Eu-$\lambda_{pe}$=650 nm) and Dev.5 comprises 85.1 wt % GAL520, 9.2 wt % GAL484, 0.5 wt % CASN628 (Ca$_{1-x}$Sr$_x$AlSiN$_3$:Eu-$\lambda_{pe}$=628 nm) and 5.2 wt % CASN650. As described above, Dev.4 comprises two solid-state light sources (LEDs) with a respective dominant wavelength $\lambda_{d1}=446$ nm and $\lambda_{d2}=463$ nm, while Dev.5 comprises three LED with a respective dominant wavelength $\lambda_{d1}=448$ nm, $\lambda_{d2}=453$ nm and $\lambda_{d3}=461$ nm.

TABLE 16

5000K light emitting device phosphor composition

| | Phosphor composition (wt. %) | | | |
|---|---|---|---|---|
| | Green to Yellow | | Orange to Red | |
| Device | GAL484 | GAL520 | CASN628 | CASN650 |
| Dev. 4 | 12.9 | 78.1 | — | 9.0 |
| Dev. 5 | 9.2 | 85.1 | 0.5 | 5.2 |

Tables 17, 18 and 19 tabulates measured optical test data for packaged light emitting devices Dev.4 and Dev.5. These data illustrate that full spectrum white light emitting devices in accordance with the invention that provide utility can be constituted by broadband blue solid-state excitation source comprising a combination of two solid-state light sources (LEDs) of different dominant wavelengths ($\lambda_{d1}=446$ nm and $\lambda_{d2}=463$ nm) or a combination of three solid-state LEDs of different dominant wavelength ($\lambda_{d1}=448$ nm, $\lambda_{d2}=453$ nm and $\lambda_{d3}=461$ nm).

It is to be noted from these tables that device Dev.4 has a high luminous efficacy LE of 267.4 lm/W$_{opt}$ and produces white light: (i) in which each of CRI R1 to CRI R15 are approximately 90 or higher, (ii) having a high CRI R11 ("Saturated Green") of 99.5, (iii) having a high CRI R12 ("Saturated Blue") of 89.0, (iv) having a high general color rendering index CRI Ra of 98.0, (v) having a high color rendering index CRI Rall (average of R1 to R15) of 97.1, and (vi) having a high IEC TM-30 fidelity index $R_f$ of 95.4.

It is to be noted from these tables that device Dev.5 has a high luminous efficacy LE of 268.5 lm/$W_{opt}$ and produces white light: (i) in which with the exception of CRI R12 each of CRI R1 to CRI R15 is 90 or higher, (ii) having a high CRI R11 ("Saturated Green") of 97.0, (iii) having a high general color rendering index CRI Ra of 97.3, (iv) having a high color rendering index CRI Rall (average of CRI R1 to R15) of 95.3, and (v) having a high IEC TM-30 fidelity index $R_f$ of 92.3.

TABLE 17

5000K packaged light emitting device-Measured test data

| Device | LE (lm/$W_{opt}$) | LE (%) | CIE x | CIE y | CCT (K) |
|---|---|---|---|---|---|
| Dev. 4 | 267.4 | 99.5 | 0.3492 | 0.3565 | 4864 |
| Dev. 5 | 268.5 | 100.0 | 0.3458 | 0.3521 | 4974 |

TABLE 18

5000K packaged light emitting device - Measured test data

| | CIE Color Rendering CRI | | | | | | | |
|---|---|---|---|---|---|---|---|---|
| Device | R1 | R2 | R3 | R4 | R5 | R6 | R7 | R8 | R9 |
| Dev.4 | 98.0 | 99.0 | 98.1 | 98.1 | 99.3 | 98.4 | 97.9 | 96.5 | 90.8 |
| Dev.5 | 98.5 | 98.6 | 95.4 | 97.7 | 96.6 | 94.4 | 99.1 | 97.9 | 95.8 |

TABLE 19

5000K packaged light emitting device - Measured test data

| | CIE Color Rendering CRI | | | | | | | IES TM-30-15 | |
|---|---|---|---|---|---|---|---|---|---|
| Device | R10 | R11 | R12 | R13 | R14 | R15 | Ra | Rall | Rf | Rg |
| Dev.4 | 99.2 | 99.5 | 89.0 | 97.9 | 98.4 | 96.1 | 98.0 | 97.1 | 95.4 | 101.1 |
| Dev.5 | 95.0 | 97.0 | 72.0 | 98.8 | 97.2 | 95.8 | 97.3 | 95.3 | 92.3 | 100.7 |

Figure 11:
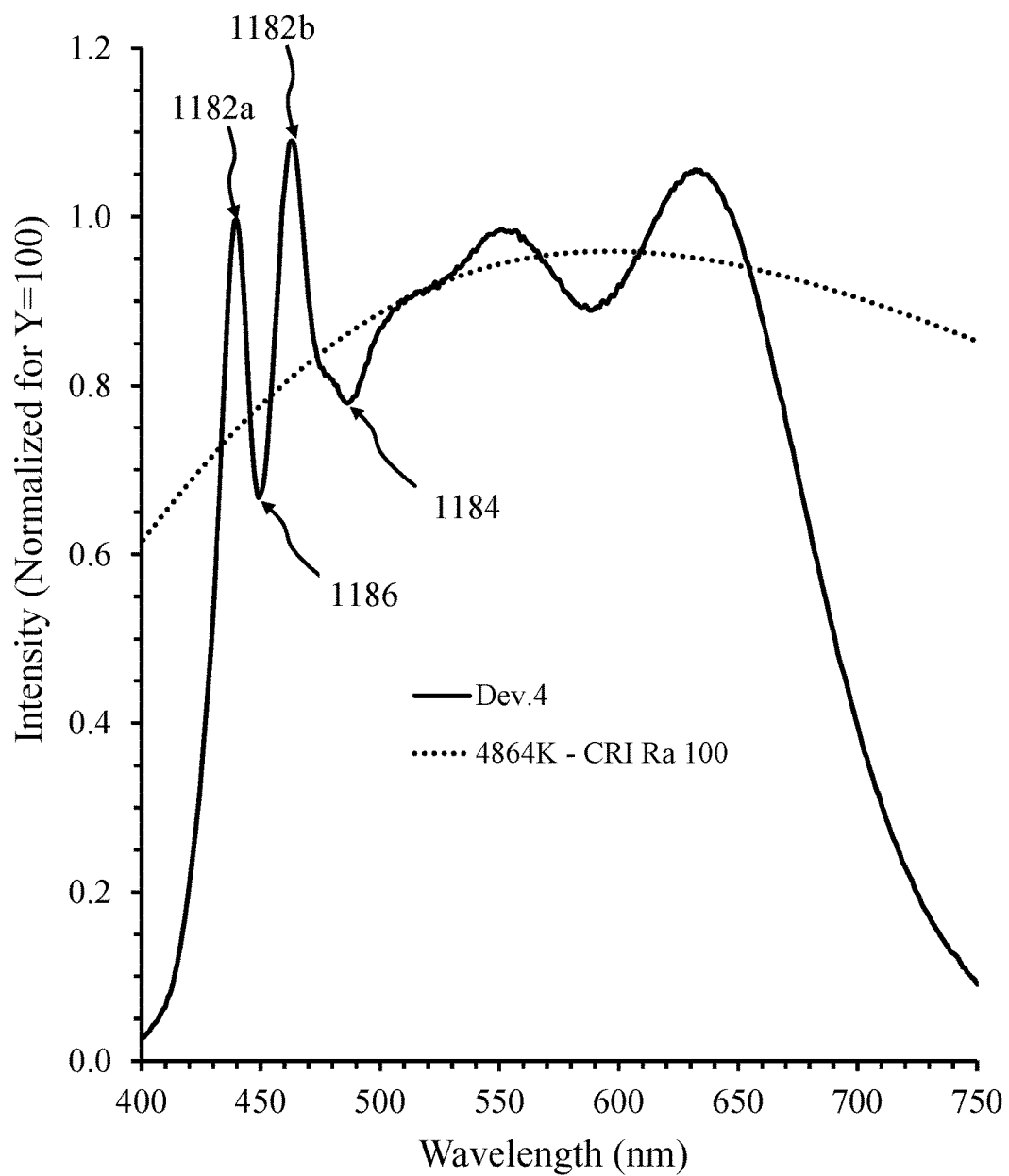
FIG. 11 are emission spectra, normalized intensity (normalized to a CIE 1931 XYZ relative luminance Y=100) versus wavelength (nm) for (i) Dev.4 (solid line) and (ii) Planckian spectrum (dotted line) for a CCT that is the same as that of Dev.4 (4864 K)
Figure 12:
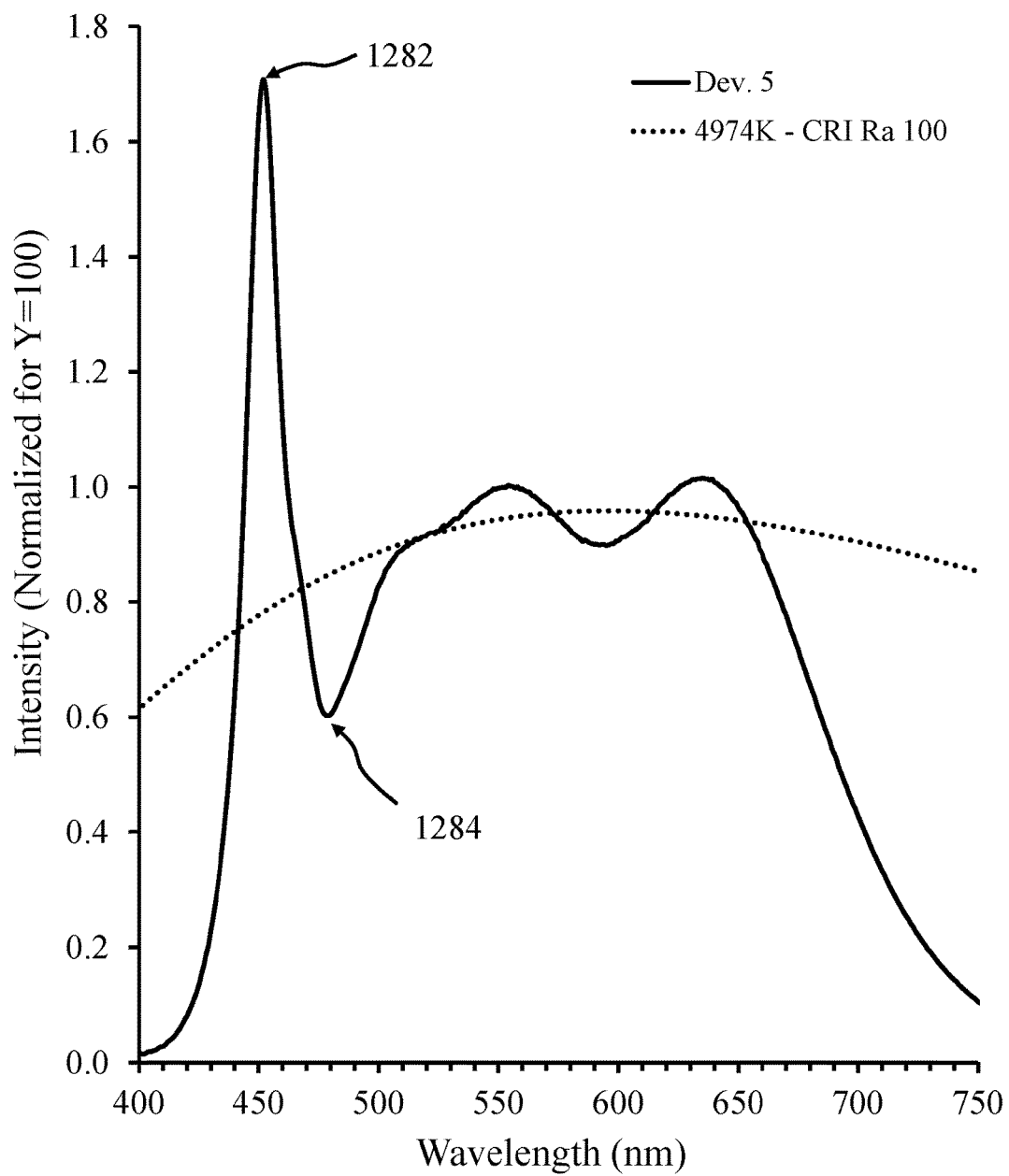
FIG. 12 are emission spectra, normalized intensity (normalized to a CIE 1931 XYZ relative luminance Y=100) versus wavelength (nm) for (i) Dev.5 (solid line) and (ii) Planckian spectrum (dotted line) for a CCT that is the same as that of Dev.5 (4974 K)

FIG. 11 shows normalized intensity versus wavelength (nm) for (i) Dev. 4 (thick solid line) and (ii) Planckian spectrum (thin solid line) for a CCT that is the same as that of Dev.4 (4864 K). As can be seen from the figure, the spectrum (thick solid line) closely resembles the Planckian spectrum and exhibits two pronounced peaks 1182a and 1182b separated by a deep trough 1186 at about 450 nm the combination of which corresponds to the broadband blue excitation light and a trough 1184 in the cyan region (480 nm) of the spectrum. It is believed that the lower value of CRI R12 of 89.0 compared with the values of CRI R1 to R11 and R13 to R15 (Tables 18 and 19) results from the trough 1186 which drops below the Planckian spectrum and the trough due to the difference in the LED dominant wavelengths being too high ($\lambda_{d1}$=446 nm and $\lambda_{d2}$=463 nm−Δ $\lambda_d$=17 nm). The value of CRI R12 can therefore be increased to 90 or higher by reducing the difference in dominant wavelength of the LEDs. FIG. 12 shows normalized intensity versus wavelength (nm) for (i) Dev. 5 (thick solid line) and (ii) Planckian spectrum (thin solid line) for a CCT that is the same as that of Dev.5 (4974 K). Each spectrum has been normalized such each has a CIE 1931 XYZ relative luminance Y=100. As can be seen from the figure, the spectrum (thick solid line) exhibits a peak 1282 and trough 1284 and closely resembles the Planckian spectrum.

Solid-State White Emitting Devices Comprising Broadband Blue Solid-State Light Sources Packaged white light emitting devices in accordance with the invention comprising broadband LED chips comprise a single cavity 2835 (2.8 mm by 3.5 mm) SMD package containing a single 2630 (26 mil by 30 mil) 239 mW broadband LED chip die (MQW LED chip die) of dominant wavelength $\lambda_d$=455.8 nm and FWHM 34 nm.

Table 20 tabulates phosphor compositions for nominal 4000K and 5000K SMD packaged white light emitting device in accordance with the invention, denoted Dev.6 and Dev.7 respectively.

As can be seen from Table 20, in terms of phosphor composition: Dev.6 comprises 91.2 wt % GAL520 ($Lu_{3-x}(Al_{1-y}Ga_y)_5O_{12}:Ce_x-\lambda_{pe}$=520 nm), 0.6 wt % CASN628 ($Ca_{1-x}Sr_xAlSiN_3:Eu-\lambda_{pe}$=628 nm) and 8.2 wt % CASN650 ($Ca_{1-x}Sr_xAlSiN_3:Eu-\lambda_{pe}$=650 nm) and Dev.7 comprises 90.4 wt % GAL520 and 8.6 wt % CASN650.

TABLE 20

4000K and 5000K SMD packaged white light emitting device phosphor composition

| | Phosphor composition (wt. %) | | |
|---|---|---|---|
| | Green to Yellow | Orange to Red | |
| Device | GAL520 | CASN628 | CASN650 |
| Dev. 6 | 91.2 | 0.6 | 8.2 |
| Dev. 7 | 90.4 | — | 8.6 |

Tables 21, 22 and 23 tabulates measured optical test data for packaged light emitting devices Dev.6 and Dev.7. It is to be noted from these tables that device Dev.6 has a high luminous efficacy LE of 276.8 lm/$W_{opt}$ and produces white light: (i) in which each of CRI R1 to CRI R15 is approximately 95 or higher, (ii) having a high CRI R11 ("Saturated Green") of 98.9, (iii) having a high CRI R12 ("Saturated Blue") of 96.6, (iv) having a high general color rendering index CRI Ra of 98.6, (v) having a high color rendering index CRI Rall (average of CRI R1 to R15) of 98.3, and (vi) having a high IEC TM-30 fidelity index $R_f$ of 95.2. It is to be noted from these tables that device Dev.7 has a high luminous efficacy LE of 268.0 lm/$W_{opt}$ and produces white light having (i) in which each of CRI R1 to CRI R15 is approximately 95 or higher, (ii) having a high CRI R11 ("Saturated Green") of 98.5, (iii) a high CRI R12 ("Saturated Blue") of 97.2, (iv) a high general color rendering index CRI Ra of 98.8, (v) a high color rendering index CRI Rall (average of CRI R1 to R15) of 98.4, and (vi) a high IEC TM-30 fidelity index $R_f$ of 95.9. The lower value of CRI R12 of 94.7 compared with the values of CRI R1 to R8 and R10 to R15 (Tables 22 and 23) can be increased to 95 or higher by adjusting the phosphor composition for example increasing the wt %. of CASN650 though this may reduce the luminous efficacy slightly.

TABLE 21

4000K and 5000K SMD packaged white light emitting device-
Measured test data

| Device | LE (lm/W$_{opt}$) | CIE x | CIE y | CCT (K) |
|---|---|---|---|---|
| Dev. 6 | 276.8 | 0.3793 | 0.3785 | 4042 |
| Dev. 7 | 268.0 | 0.3447 | 0.3538 | 5010 |

TABLE 22

4000K and 5000K SMD packaged white light emitting device -
Measured test data

| | CIE Color Rendering CRI | | | | | | | |
|---|---|---|---|---|---|---|---|---|
| Device | R1 | R2 | R3 | R4 | R5 | R6 | R7 | R8 | R9 |
| Dev.6 | 99.5 | 99.1 | 99.2 | 98.0 | 99.2 | 98.5 | 97.9 | 97.5 | 94.7 |
| Dev.7 | 98.4 | 98.9 | 99.2 | 98.9 | 98.6 | 98.3 | 99.8 | 98.3 | 94.7 |

TABLE 23

4000K and 5000K SMD packaged white light emitting device -
Measured test data

| | CIE Color Rendering CRI | | | | | | | IES TM-30-15 | |
|---|---|---|---|---|---|---|---|---|---|
| Device | R10 | R11 | R12 | R13 | R14 | R15 | Ra | Rall | R$_f$ | R$_g$ |
| Dev.6 | 98.6 | 98.9 | 96.6 | 98.9 | 99.3 | 98.6 | 98.6 | 98.3 | 95.2 | 98.8 |
| Dev.7 | 98.4 | 98.5 | 97.2 | 98.5 | 99.1 | 97.7 | 98.8 | 98.4 | 95.9 | 100.0 |

Figure 13:
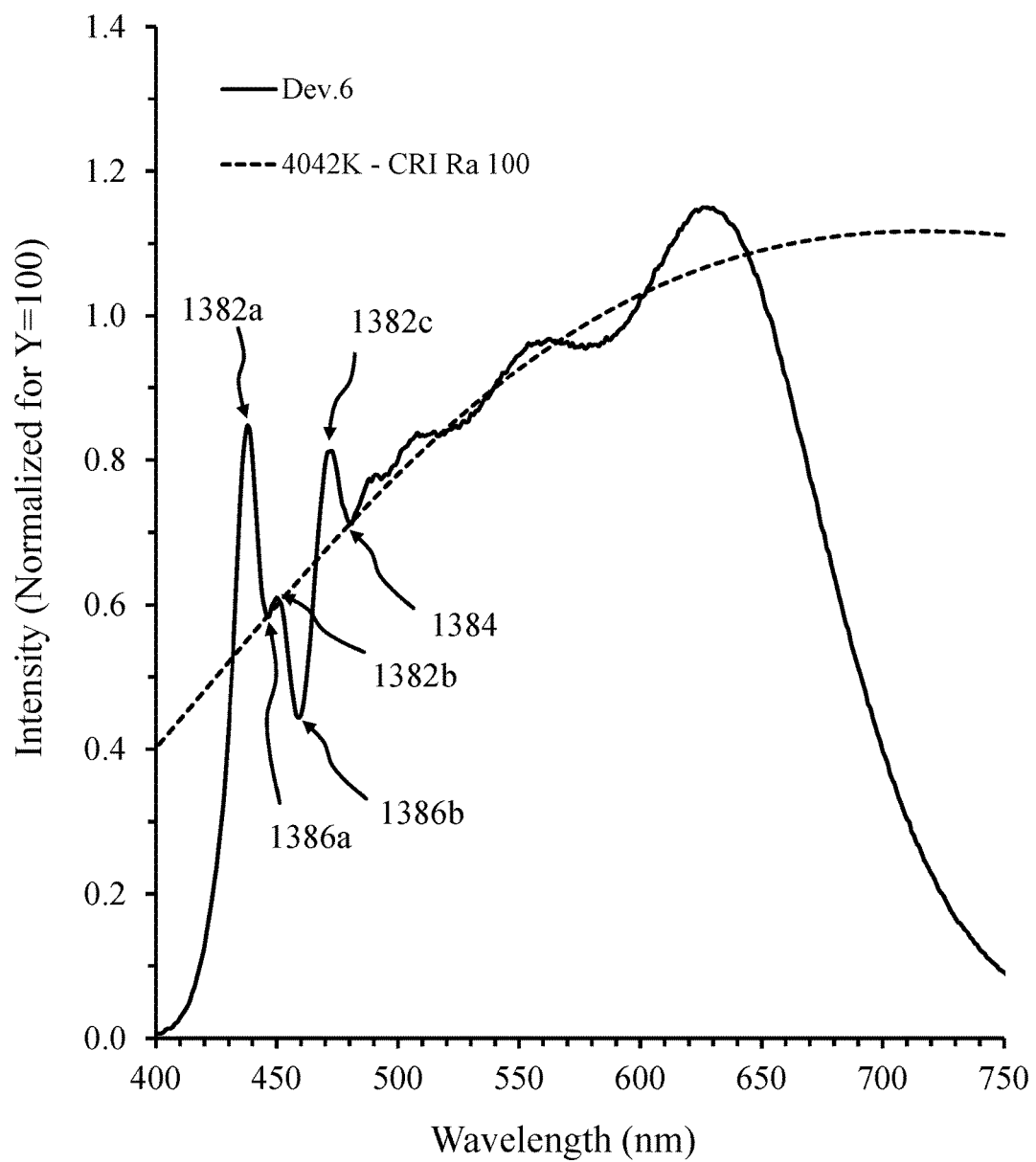
FIG. 13 are emission spectra, normalized intensity (normalized to a CIE 1931 XYZ relative luminance Y=100) versus wavelength (nm) for (i) Dev. 6 (solid line) and (ii) Planckian spectrum (dashed line) for a CCT that is the same as that of Dev.6 (4042 K)

FIG. 13 shows normalized intensity versus wavelength (nm) for (i) Dev. 6 (solid line) and (ii) Planckian spectrum (dashed line) for a CCT that is the same as that of Dev.6 (4042 K). As can be seen from the figure, the spectrum (thick solid line) closely resembles the Planckian spectrum and exhibits three peaks 1382a, 1382b and 1382c separated by troughs 1386a and 1386b at about 450 nm and 460 nm respectively the combination of which corresponds to the broadband blue excitation light and a trough 1384 in the cyan region (480 nm) of the spectrum. It is believed that the lower value of CRI R12 of 96.6 compared with the values of CRI R1 to R11 and R13 to R15 (Tables 22 and 23) results from the trough 1386b which drops below the Planckian spectrum and the trough due to the difference in the wavelength of the blue light emissions generated by the multiple different quantum wells of the MQW LED chip. The value of CRI R12 can be increased to 98 or higher by configuring the quantum wells of the MQW LED chip to reduce the difference in blue light emissions.

Figure 14:
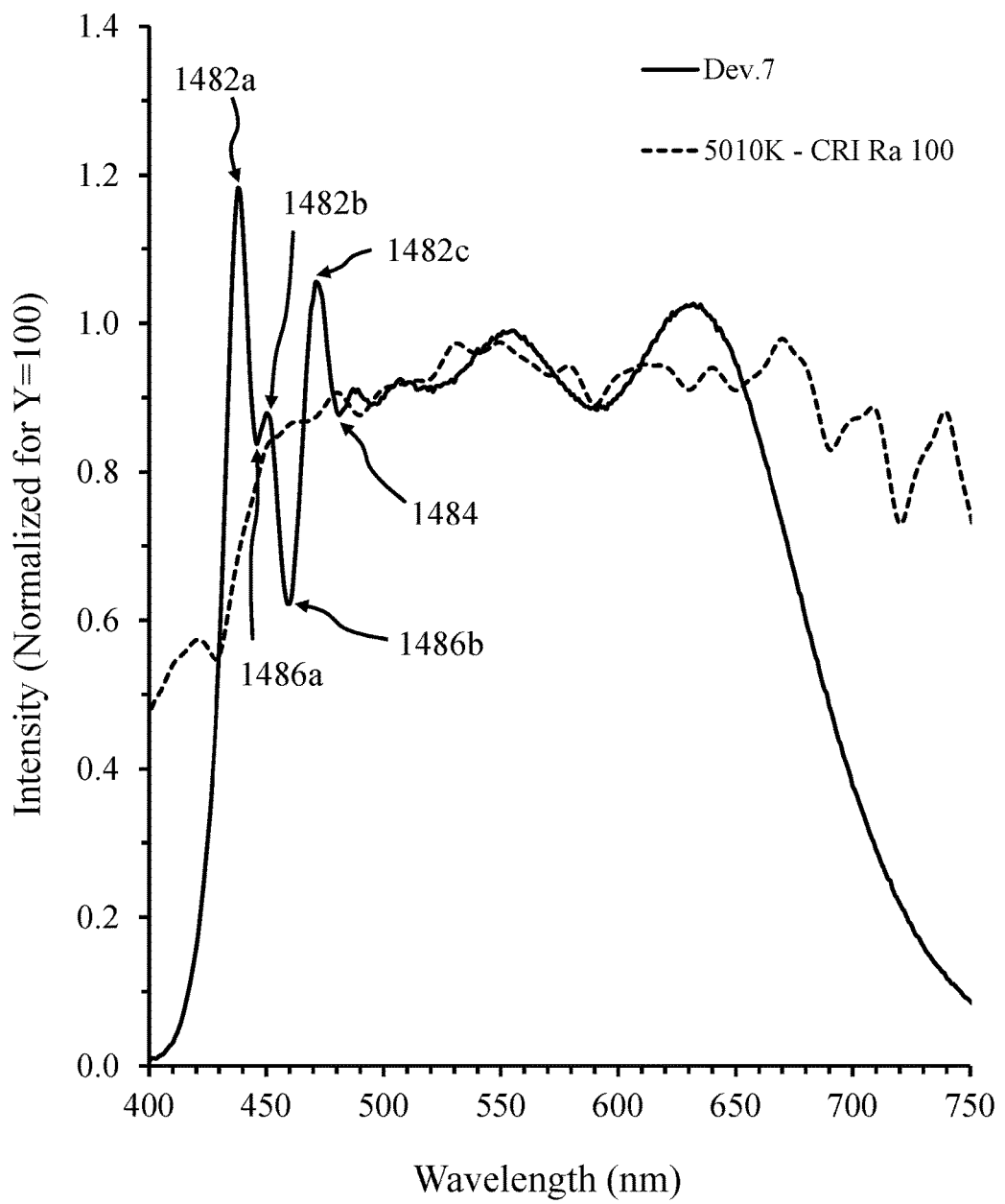
FIG. 14 are emission spectra, normalized intensity (normalized to a CIE 1931 XYZ relative luminance Y=100) versus wavelength (nm) for (i) Dev. 7 (solid line) and (ii) Sunlight Spectrum (dashed line) for a CCT that is the same as that of Dev.7 (5010 K)

FIG. 14 shows normalized intensity versus wavelength (nm) for (i) Dev. 7 (solid line) and (ii) Sunlight Spectrum (dashed line) for a CCT that is the same as that of Dev.7 (5010 K). The Sunlight Spectrum is based on the CIE standard illuminant D55 and is a proportional blend from Planckian radiation below 4000K to daylight for temperatures above 5500K. As can be seen from the figure, the spectrum (thick solid line) closely resembles the Sunlight Spectrum and exhibits three peaks 1482a, 1482b and 1482c separated by troughs 1486a and 1486b at about 450 nm and 460 nm respectively the combination of which corresponds to the broadband blue excitation light and a trough 1484 in the cyan region (480 nm) of the spectrum. As described in relation to Dev.6 (FIG. 13) it is believed that the lower value of CRI R12 of 97.2 compared with the values of CRI R1 to R11 and R13 to R15 (Tables 22 and 23) results from the trough 1486b which drops below the Planckian spectrum and the trough due to the difference in the wavelength of the blue light emissions generated by the multiple different quantum wells of the MQW LED chip. The value of CRI R12 can be increased to 98 or higher by configuring the quantum wells of the MQW LED chip to reduce the difference in blue light emissions.

Each spectrum shown in FIGS. 13 and 14 has been normalized such each has a CIE 1931 XYZ relative luminance Y=100.

COB Packaged White Light Emitting Devices Comprising Broadband Blue LED Chips

COB Packaged white light emitting devices in accordance with the invention comprising broadband blue LED chips comprise a COB package containing twenty four 2630 (26 mil by 30 mil) 204 mW broadband LED chip die (MQW LED chip die) of dominant wavelength $\lambda_d$=459.5 nm and FWHM 34 nm.

Table 24 tabulates phosphor compositions for a nominal 4000K COB packaged white light emitting device in accordance with the invention, denoted Dev.8.

As can be seen from Table 24, in terms of phosphor composition: Dev.8 comprises 88.1 wt % GAL520 (Lu$_{3-x}$(Al$_{1-y}$Ga$_y$)$_5$O$_{12}$:Ce$_x$-$\lambda_{pe}$=520 nm) and 11.9 wt % CASN650 (Ca$_{1-x}$Sr$_x$AlSiN$_3$:Eu-$\lambda_{pe}$=650 nm).

TABLE 24

4000K COB packaged white light emitting device-
phosphor composition

| | Phosphor composition (wt. %) | |
|---|---|---|
| | Green to Yellow | Orange to Red |
| Device | GAL520 | CASN650 |
| Dev. 8 | 88.1 | 11.9 |

Tables 25, 26 and 27 tabulates measured optical test data for the COB packaged white light emitting device Dev.8. It is to be noted from these tables that device Dev.8 produces white light: (i) in which each of CRI R1 to CRI R15 is 90 or higher, (ii) having a high CRI R11 ("Saturated Green") of 96.1, (iii) having a high CRI R12 ("Strong Blue") of 92.1, (iv) having a high general color rendering index CRI Ra of 96.5, (v) having a high color rendering index CRI Rall (average of CRI R1 to R15) of 95.9, and (vi) a high IEC TM-30 fidelity index R$_f$ of 93.4. Further, it is to be noted that while solid-state white light emitting devices in accordance with the invention generate high quality (color rendering) white light, they also have a high luminous efficacy LE of 269.7 lm/W$_{opt}$.

TABLE 25

4000K COB packaged light emitting device-Measured test data

| Device | LE (lm/W$_{opt}$) | CIE x | CIE y | CCT (K) |
|---|---|---|---|---|
| Dev. 8 | 269.7 | 0.3831 | 0.3795 | 3949 |

TABLE 26

5000K packaged light emitting device - Measured test data

CIE Color Rendering CRI

| Device | R1 | R2 | R3 | R4 | R5 | R6 | R7 | R8 | R9 |
|---|---|---|---|---|---|---|---|---|---|
| Dev.8 | 96.0 | 96.6 | 98.5 | 96.2 | 96.2 | 95.2 | 96.6 | 96.9 | 94.0 |

TABLE 27

5000K packaged light emitting device - Measured test data

| | CIE Color Rendering CRI | | | | | | | IES TM-30-15 | |
|---|---|---|---|---|---|---|---|---|---|
| Device | R10 | R11 | R12 | R13 | R14 | R15 | Ra | Rall | R$_f$ | R$_g$ |
| Dev.8 | 93.6 | 96.1 | 92.1 | 95.7 | 99.0 | 96.0 | 96.5 | 95.9 | 93.4 | 98.9 |

Figure 15:
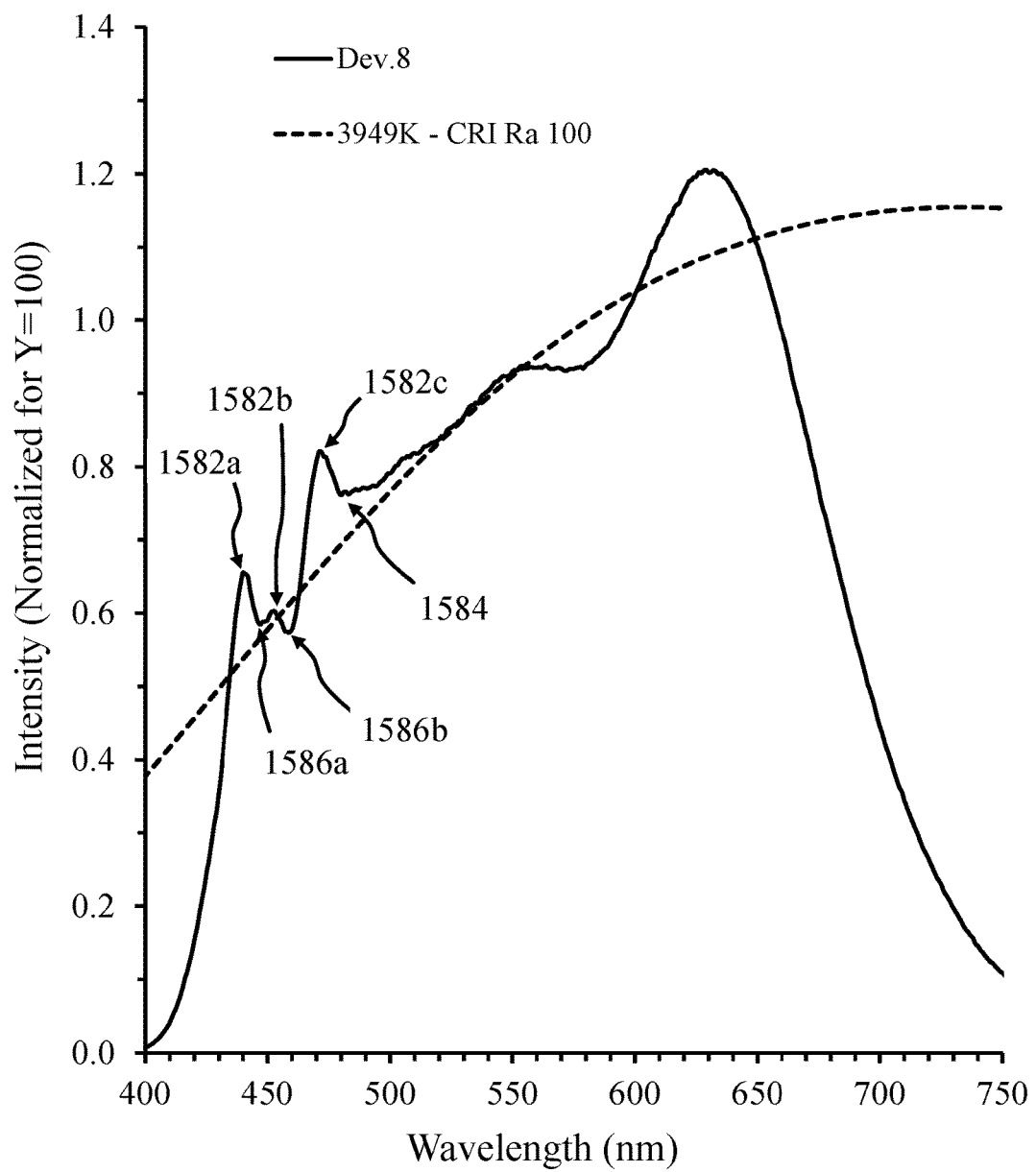
FIG. 15 are emission spectra, normalized intensity (normalized to a CIE 1931 XYZ relative luminance Y=100) versus wavelength (nm) for (i) Dev. 8 (thick solid line) and (ii) Planckian spectrum (dashed line) for a CCT that is the same as that of Dev.8 (3949 K)

FIG. 15 shows normalized intensity versus wavelength (nm) for (i) Dev. 8 (thick solid line) and (ii) Planckian spectrum (dashed line) for a CCT that is the same as that of Dev.8 (3949 K). As can be seen from the figure, the spectrum (thick solid line) closely resembles the Planckian spectrum and exhibits three peaks 1582a, 1582b and 1582c separated by troughs 1586a and 1586b at about 450 nm and 460 nm respectively the combination of which corresponds to the broadband blue excitation light and a trough 1584 in the cyan region (480 nm) of the spectrum. It is believed that the lower value of CRI R12 of 96.2 compared with the values of CRI R1 to R11 and R13 to R15 (Tables 26 and 27) results from the trough 1586b which drops below the Planckian spectrum and the trough due to the difference in the wavelength of the blue light emissions generated by the multiple different quantum wells of the MQW LED chip. The value of CRI R12 can be increased to 98 or higher by configuring the quantum wells of the MQW LED chip to reduce the difference in blue light emissions.

As can be seen from the figure, the spectrum (thick solid line) exhibits three peaks 1582a, 1582b and 1582c, and trough 1584 and closely resembles the Planckian spectrum. Each spectrum has been normalized such each has a CIE 1931 XYZ relative luminance Y=100.

While the invention arose in relation to full spectrum white light emitting devices for generating full spectrum white light having high color rendering qualities, light emitting devices in accordance with the invention comprising a broadband blue solid-state excitation source also offer advantages for light emitting devices that generate light with lower CRI Ra, for example greater than or equal to 70 or 80. In such applications the use of a broadband blue solid-state excitation source can reduce damage to the human retina and/or reduce degeneration of the human macular compared with the known white LEDs that utilize narrow band blue excitation sources. It is believed that this is because the same blue photon energy is distributed over a greater wavelength range thereby reducing the intensity of the blue peak.

Tables 28, 29 and 30 tabulates simulated optical test data for nominal 6500K, CRI Ra 80 light emitting devices Com.4 and Dev.9 and illustrate the effect on light emitting device optical performance of using a broadband blue excitation source in accordance with the invention comprising a combination of narrowband LEDs of three different dominant wavelengths ($\lambda_{d1}$=443 nm, $\lambda_{d2}$=455 nm and $\lambda_{d3}$=468 nm) compared with using an excitation comprising narrowband LEDs of a single dominant wavelength ($\lambda_d$=455 nm). It is to be noted from these tables that device Dev.9 produces white light in which (i) there is an increase in CRI R11 ("Saturated Green")—84.0 compared with 82.7 (ii) there is a substantial increase in CRI R12 ("Saturated Blue")—70.1 compared with 55.2. Further, it is to be noted that while the invention results in an increase in the quality (color rendering) of light, there is only a small reduction 2.2% in luminous efficacy LE, and Dev.9 has a high luminous efficacy LE of 305.3 lm/W$_{opt}$.

TABLE 28

6500K, CRI Ra 80 light emitting devices-Simulated data

| Device | LE (lm/W$_{opt}$) | CIE x | CIE y | CCT (K) |
|---|---|---|---|---|
| Com. 4 | 312.2 | 0.312 | 0.328 | 6543 |
| Dev. 9 | 305.3 | 0.312 | 0.328 | 6535 |

TABLE 29

6500K, CRI Ra 80 light emitting devices - Simulated data

CIE Color Rendering CRI

| Device | R1 | R2 | R3 | R4 | R5 | R6 | R7 | R8 |
|---|---|---|---|---|---|---|---|---|
| Com.4 | 81.3 | 87.3 | 90.2 | 83.1 | 81.9 | 81.4 | 87.8 | 69.2 |
| Dev.9 | 83.2 | 89.5 | 93.0 | 84.6 | 84.2 | 85.4 | 88.4 | 70.3 |

TABLE 30

6500K, CRI Ra 80 light emitting devices - Simulated data

CIE Color Rendering CRI

| Device | R9 | R10 | R11 | R12 | R13 | R14 | R15 | Ra | Rall |
|---|---|---|---|---|---|---|---|---|---|
| Com.4 | 3.9 | 69.0 | 82.7 | 55.2 | 83.2 | 95.0 | 76.0 | 82.8 | 75.1 |
| Dev.9 | 8.6 | 74.2 | 84.0 | 70.1 | 85.1 | 96.4 | 77.5 | 84.8 | 78.4 |

Figure 16:
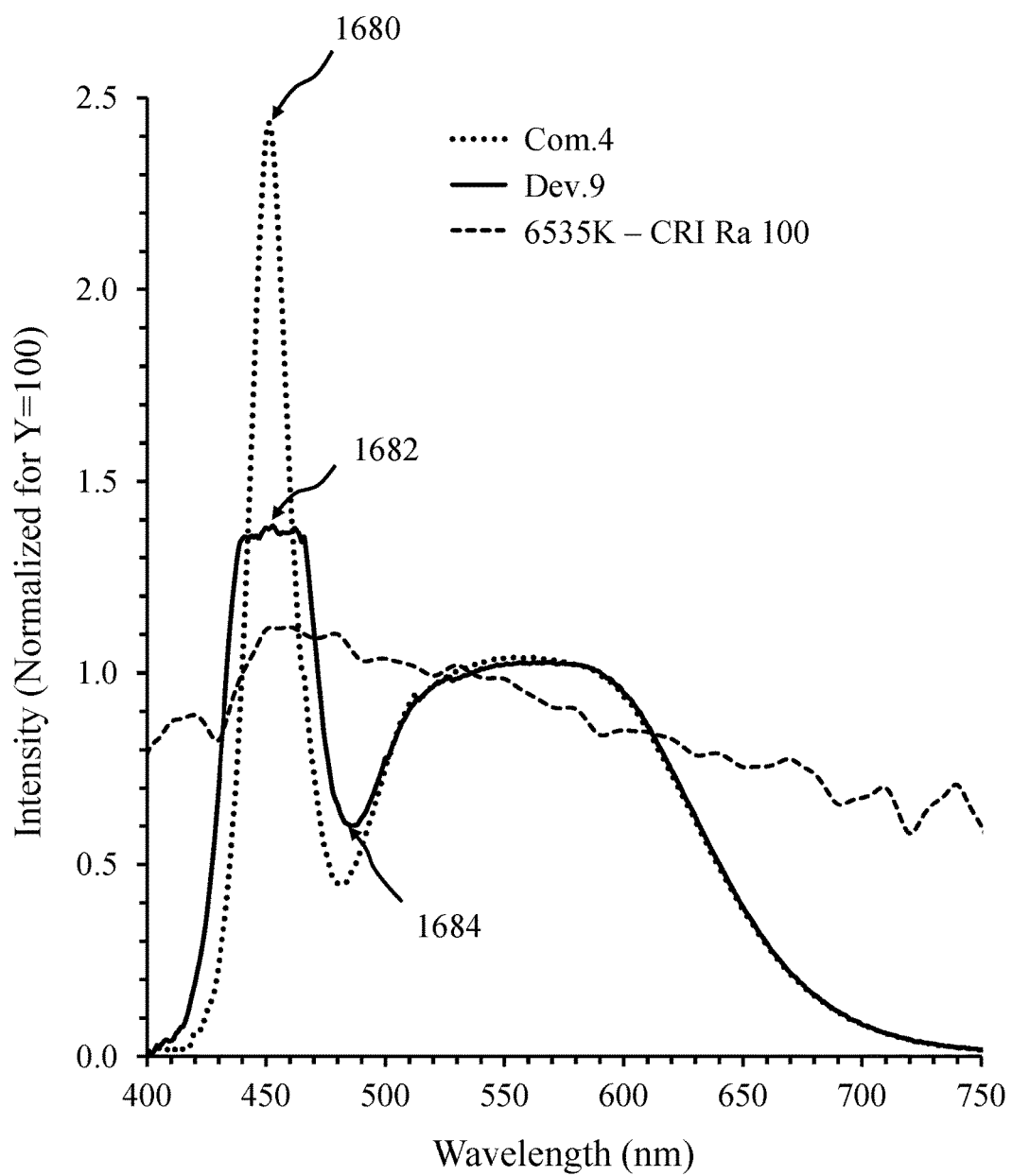
FIG. 16 are simulated emission spectra, normalized intensity (normalized to a CIE 1931 XYZ relative luminance Y=100) versus wavelength (nm) for (i) Dev.9 (thick solid line), (ii) Com.4 (dashed line) and (iii) Sunlight spectrum (dotted line) for a CCT that is the same as that of Dev.9 (6535 K).

FIG. 16 are simulated emission spectra, normalized intensity (normalized to a CIE 1931 XYZ relative luminance Y=100) versus wavelength (nm) for (i) Dev.9 (solid line), (ii) Com.4 (dotted) and (iii) Sunlight Spectrum (dashed line) for a CCT that is the same as that of Dev.9 (i) (6535K).

Referring to FIG. 16, it will be noted that the most pronounced effect on the emission spectra—spectral energy content—of the device in accordance with the invention (i.e. broadband blue solid-state excitation source comprising three solid-state light sources with different dominant wavelengths) compared with the comparative device (i.e. excitation source comprising solid-state light sources with a single dominant wavelength) are: (i) a broadening of the blue emission peak 1682, (ii) a reduction in the intensity of the blue emission peak 1682 and (iii) a decrease in trough 1684 in the cyan region of the spectrum at about 490 nm. As can be seen from the figure, the reduction of the blue emission peak 1682 of Dev.9 (compared with peak 1680 of Com.4) and decrease in trough 1684 results in the emission spectrum more closely resembling the Sunlight Spectrum. It is believed that this change in spectral energy content resulting from the use of a broadband blue excitation source, in this embodiment comprising three solid-state light sources, with different dominant wavelengths (blue light emissions) partially fills the trough in the cyan region of the spectrum accounts for the superior color rendering properties of the devices of the invention; in particular, the increase in CRI R11 and CRI R12.

A described above, a further advantage of the present invention is that white light emitting devices according to the invention can reduce or possibly prevent the likelihood of damage to the human retina and macula by reducing High Energy Visible (HEV) blue light in the wavelength region 400-500 nm. The blue photon energy (area under the peak) for the blue peaks 1680 (Com.4) and 1682 (Dev.9) are substantially the same. However, in the case of the peak 1682 this energy is distributed over a greater wavelength range thereby reducing the intensity of the blue peak compared with the peak 1682. Since the white light emitting device of the present invention exhibits a reduction in the blue emission peak (i.e. HEV), the likelihood of damage being caused to the human retina and degeneration of the human macula is reduced or prevented.

In summary, it will be appreciated that light emitting devices in accordance with the invention comprising a broadband blue solid-state excitation source that generates broadband blue excitation light composed of a combination of at least two different wavelength blue light emissions have superior color rendering compared with known devices that comprise one or more narrowband solid-state light source(s) of a single dominant wavelength. For instance, the broadband blue solid-state excitation source may comprise two or more narrowband solid-state light sources (for example, LEDs), or one or more broadband solid-state light sources (for example, LED(s) having an active region with multiple different quantum wells that are configured to generate blue light emissions of different peak wavelengths). Moreover, embodiments of the invention enable the implementation of full spectrum white light emitting devices that are characterized by generating white light having a color temperature in a range 2500K to 6500K with one or more of (i) a CRI R1 to CRI R15 of greater than or equal to 90, (ii) a CRI R11 ("Saturated Green") of greater than or equal to 90, (iii) a CRI R12 ("Saturated Blue") of greater than or equal to 90, (iv) a CRI Ra greater than or equal to 95, (v) a CRI Ra of greater than or equal to 98, (vi) a IEC TM-30 fidelity index $R_f$ of greater than or equal to 96 and (vii) a luminous efficacy (LE) of greater than or equal to 220 lm/W$_{opt}$.

Although the present invention has been particularly described with reference to certain embodiments thereof, it should be readily apparent to those of ordinary skill in the art that changes and modifications in the form and details may be made without departing from the spirit and scope of the invention.

It will be understood that the following clauses form part of the disclosure of the invention defined herein. More particularly, the invention herein may be defined by the combination of the features of the clauses as detailed below, and said clauses provide a basis to amend the combination of the features within the claims of this application.

Clauses

1. A full spectrum white light emitting device comprising:
    photoluminescence materials which generate light with a peak emission wavelength in a range 490 nm to 680 nm and
    a broadband blue solid-state excitation source operable to generate broadband blue excitation light with a dominant wavelength in a range from 420 nm to 480 nm,
    wherein the broadband blue excitation light comprises at least two different wavelength blue light emissions in a range 420 nm to 480 nm.
2. The light emitting device of Clause 1, characterized by generating white light with a CRI R1 to CRI R15 of greater than or equal to 90.
3. The light emitting device of Clause 2, characterized by generating white light with a CRI Ra of greater than or equal to 95.
4. The light emitting device of Clause 1 or Clause 2, characterized by generating white light with a CRI R1 to CRI R15 of greater than or equal to 95.
5. The light emitting device of Clause 4, characterized by generating white light with a CRI Ra of greater than or equal to 99.
6. The light emitting device of Clause 1, characterized by generating white light with a CRI Ra of greater than or equal to 80.
7. The light emitting device of any preceding clause, characterized by generating white light with a CRI R12 of greater than or equal to 90.
8. The light emitting device of any preceding clause, wherein the light emitting device is operable to generate white light with a color temperature in a range from about 2500 K to about 6500K.
9. The light emitting device of any preceding clause, wherein the light emitting device is operable to generate white light with a color temperature in a range from about 2500 K to about 3000K.
10. The light emitting device of any of Clauses 1 to 8, wherein the light emitting device is operable to generate white light with a color temperature in a range from about 4000 K to about 6500K.
11. The light emitting device of any preceding clause, characterized by generating white light with a IEC TM-30 fidelity index $R_f$ of greater than or equal to 96.
12. The light emitting device of any preceding clause, wherein there is a difference in wavelength between the at least two blue light emissions of at least 5 nm.
13. The light emitting device of any preceding clause, wherein there is a difference in wavelength between the at least two blue light emissions of at least 10 nm.
14. The light emitting device of any preceding clause, wherein the broadband blue solid-state excitation source generates broadband blue excitation light with a FWHM in a range 25 nm to 50 nm.
15. The light emitting device of any preceding clause, wherein the broadband blue solid-state excitation source comprises:
    a first solid-state light source operable to generate a blue light emission with a first dominant wavelength in a range 420 nm to 480 nm and a second solid-state light source operable to generate a different blue light emission with a second dominant wavelength in a range 420 nm to 480 nm.

16. The light emitting device of Clause 15, wherein the first dominant wavelength is in a range from 420 nm to 450 nm; and the second dominant wavelength is in a range from 450 nm to 480 nm.

17. The light emitting device of any of Clauses 1 to 14, wherein the broadband blue solid-state excitation source comprises an LED having an active region with at least two different quantum wells that each generate a respective one of the at least two different wavelength blue light emissions.

18. The light emitting device of any preceding clause, wherein the photoluminescence materials comprise a green to yellow photoluminescence material which generates light with a peak emission wavelength in a range 490 nm to 550 nm and a red photoluminescence material which generates light with a peak emission wavelength in a range 600 nm to 680 nm.

19. The light emitting device of any preceding clause, further comprising an orange to red photoluminescence material which generates light with a peak emission wavelength in a range 600 nm to 650 nm.

20. The light emitting device of any preceding clause, characterized by a luminous efficacy (LE) of greater than or equal to 220 lm/$W_{opt}$.

21. The light emitting device of Clause 18 or Clause 19, wherein the green to yellow photoluminescence material and red photoluminescence material are located remotely to the broadband blue solid-state excitation source.

What is claimed is:

1. A full spectrum white light emitting device comprising:
   a first photoluminescence material which generates light with a peak emission wavelength in a range 490 nm to 550 nm, and a second photoluminescence material which generates light with a peak emission wavelength in a range 600 nm to 680 nm; and
   a broadband solid-state excitation source operable to generate excitation light with a dominant wavelength in a range from 420 nm to 480 nm and a FWHM greater than or equal to 30 nm.

2. The full spectrum white light emitting device of claim 1, wherein the excitation light has a FWHM in a range selected from the group consisting of: from 30 nm to 50 nm, from 35 nm to 50 nm, from 40 nm to 50 nm, and 45 nm to 50 nm.

3. The full spectrum white light emitting device of claim 1, characterized by generating white light with a CRI R1 to CRI R15 of greater than or equal to 90.

4. The full spectrum white light emitting device of claim 3, characterized by generating white light with a CRI Ra of greater than or equal to 95.

5. The full spectrum white light emitting device of claim 1, characterized by generating white light with a CRI R1 to CRI R15 of greater than or equal to 95.

6. The full spectrum white light emitting device of claim 1, characterized by generating white light with a CRI R12 of greater than or equal to 90.

7. The full spectrum white light emitting device of claim 1, wherein the light emitting device is operable to generate white light with a color temperature in a range from about 2500 K to about 6500K.

8. The full spectrum white light emitting device of claim 1, characterized by generating white light with a IEC TM-30 fidelity index $R_f$ of greater than or equal to 96.

9. The full spectrum white light emitting device of claim 1, wherein the excitation light comprises at least two different wavelength blue light emissions.

10. The full spectrum white light emitting device of claim 9, wherein the solid-state excitation source comprises:
    a first LED operable to generate a blue light emission with a first dominant wavelength in a range 420 nm to 480 nm; and
    a second LED operable to generate a different blue light emission with a second dominant wavelength in a range 420 nm to 480 nm.

11. The full spectrum white light emitting device of claim 9, wherein the blue solid-state excitation source comprises an LED having an active region with at least two different quantum wells that each generate a respective one of the at least two different wavelength blue light emissions.

12. A full spectrum white light emitting device comprising:
    photoluminescence materials which generate light with a peak emission wavelength in a range 490 nm to 680 nm and
    a broadband blue solid-state excitation source operable to generate broadband blue excitation light with a dominant wavelength in a range from 420 nm to 480 nm, wherein the broadband blue excitation light comprises at least two different wavelength blue light emissions in a range 420 nm to 480 nm.

13. The light emitting device of claim 12, wherein the broadband blue solid-state excitation source generates broadband blue excitation light with a FWHM selected from the group consisting of: at least 30 nm, from 30 nm to 50 nm, from 35 nm to 50 nm, from 40 nm to 50 nm, and 45 nm to 50 nm.

14. The light emitting device of claim 12, wherein the broadband blue solid-state excitation source comprises:
    a first LED for generating a blue light emission with a first dominant wavelength in a range 420 nm to 480 nm and
    a second LED for generating a different wavelength blue light emission with a second dominant wavelength in a range 420 nm to 480 nm.

15. The light emitting device of claim 14, wherein the first dominant wavelength is in a range from 420 nm to 450 nm; and the second dominant wavelength is in a range from 450 nm to 480 nm.

16. The light emitting device of claim 14, further comprising a third LED for generating a blue light emission with a third dominant wavelength in a range 420 nm to 480 nm which is different from the first and second dominant wavelengths.

17. The light emitting device of claim 16, wherein the first LED has a dominant wavelength of about 441 nm; the second LED has a dominant wavelength of about 451 nm; and the third LED with a dominant wavelength of about 468 nm.

18. The light emitting device of claim 12, characterized by generating white light with a CRI R1 to CRI R15 of greater than or equal to 90.

19. The light emitting device of claim 12, characterized by generating white light with a CRI R1 to CRI R15 of greater than or equal to 95.

20. The light emitting device of claim 18 or claim 19, characterized by generating white light with a CRI Ra of greater than or equal to 95.

21. The light emitting device of claim 12, characterized by generating white light with a CRI Ra of greater than or equal to 80.

22. The light emitting device of claim 12, characterized by generating white light with a CRI R12 of greater than or equal to 90.

23. The light emitting device of claim 12, wherein the light emitting device is operable to generate white light with a color temperature in a range selected from the group consisting of: from about 2500 K to about 6500K; from about 2500 K to about 3000K; and from about 4000 K to about 6500K.

24. The light emitting device of claim 12, characterized by generating white light with a IEC TM-30 fidelity index $R_f$ of greater than or equal to 96.

25. The light emitting device of claim 12, wherein there is a difference in wavelength between the at least two blue light emissions of at least 5 nm, or a difference in wavelength between the at least two blue light emissions of at least 10 nm.

26. The light emitting device of claim 12, wherein the broadband blue solid-state excitation source comprises an LED having an active region with at least two different quantum wells that each generate a respective one of the at least two different wavelength blue light emissions.

27. The light emitting device of claim 12, wherein the green to yellow photoluminescence material and red photoluminescence material are located remotely to the broadband blue solid-state excitation source.

28. A white light emitting device comprising: a first photoluminescence material which generates light with a peak emission wavelength in a range 490 nm to 550 nm, and a second photoluminescence material which generates light with a peak emission wavelength in a range 600 nm to 680 nm; and a broadband solid-state excitation source operable to generate excitation light with a dominant wavelength in a range from 420 nm to 480 nm and a FWHM greater than or equal to 30 nm, characterized by generating white light with a CRI Ra of greater than or equal to 80.

* * * * *